United States Patent
Endo et al.

(10) Patent No.: US 7,264,918 B2
(45) Date of Patent: Sep. 4, 2007

(54) RESIST COMPOSITION FOR LIQUID IMMERSION EXPOSURE PROCESS AND METHOD OF FORMING RESIST PATTERN THEREWITH

(75) Inventors: Kotaro Endo, Kanagawa (JP); Masaaki Yoshida, Kanagawa (JP); Taku Hirayama, Kanagawa (JP); Hiromitsu Tsuji, Kanagawa (JP); Toshiyuki Ogata, Kanagawa (JP); Mitsuru Sato, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/546,529

(22) PCT Filed: Mar. 24, 2004

(86) PCT No.: PCT/JP2004/004022
§ 371 (c)(1),
(2), (4) Date: Aug. 23, 2005

(87) PCT Pub. No.: WO2004/088429
PCT Pub. Date: Oct. 14, 2004

(65) Prior Publication Data
US 2006/0154170 A1    Jul. 13, 2006

(30) Foreign Application Priority Data
Mar. 28, 2003 (JP) ............................. 2003-092768
Apr. 24, 2003 (JP) ............................. 2003-119555
Aug. 25, 2003 (JP) ............................. 2003-300664
Oct. 10, 2003 (JP) ............................. 2003-352266

(51) Int. Cl.
*G03F 7/039* (2006.01)
*G03F 7/11* (2006.01)
*G03F 7/207* (2006.01)
*G03F 7/20* (2006.01)
*G03F 7/30* (2006.01)

(52) U.S. Cl. .................... 430/326; 430/273.1; 430/327; 430/396; 430/494; 430/905; 430/907; 430/914

(58) Field of Classification Search ............. 430/270.1, 430/273.1, 905, 907, 914, 326, 327, 396, 430/494
See application file for complete search history.

(56) References Cited

U.S. PATENT DOCUMENTS 5,728,508 A    3/1998   Takemura et al.

(Continued)

FOREIGN PATENT DOCUMENTS

JP    62-065326    3/1987

(Continued)

*Primary Examiner*—Richard L. Schilling
(74) *Attorney, Agent, or Firm*—Wenderoth, Lind & Ponack, L.L.P.

(57) ABSTRACT

A resist composition for liquid immersion lithography process, which comprises: (A) a polymer comprising (a1) alkali-soluble constitutional units each comprising an alicyclic group having both (i) a fluorine atom or a fluoroalkyl group and (ii) an alcoholic hydroxyl group, wherein the polymer changes in alkali-solubility due to the action of acid; and (B) an acid generator which generates acid due to exposure to light, and a method for forming a resist pattern using the resist composition. By the resist composition or the method, an adverse effect of the immersion liquid can be avoided while achieving high resolution and high depth of focus.

24 Claims, 2 Drawing Sheets

U.S. PATENT DOCUMENTS

| | | | |
|---|---|---|---|
| 6,136,505 A | 10/2000 | Tanabe et al. | |
| 6,444,397 B2 | 9/2002 | Hada et al. | |
| 6,479,211 B1 | 11/2002 | Sato et al. | |
| 6,495,306 B2 | 12/2002 | Uetani et al. | |
| 6,509,134 B2* | 1/2003 | Ito et al. | 430/270.1 |
| 6,548,219 B2* | 4/2003 | Ito et al. | 430/270.1 |
| 6,790,587 B1* | 9/2004 | Feiring et al. | 430/270.1 |
| 6,818,258 B2* | 11/2004 | Kaneko et al. | 427/553 |
| 6,878,501 B2* | 4/2005 | Hatakeyama et al. | 430/270.1 |
| 6,916,590 B2* | 7/2005 | Kaneko et al. | 430/270.1 |
| 2002/0161148 A1 | 10/2002 | Harada et al. | |
| 2002/0177067 A1 | 11/2002 | Kim | |
| 2003/0044715 A1 | 3/2003 | Fujimori et al. | |
| 2003/0194639 A1* | 10/2003 | Miya et al. | 430/270.1 |
| 2003/0194644 A1* | 10/2003 | Hatakeyama et al. | 430/270.1 |
| 2004/0075895 A1* | 4/2004 | Lin | 359/380 |
| 2005/0123863 A1* | 6/2005 | Chang et al. | 430/322 |
| 2005/0175940 A1* | 8/2005 | Dierichs | 430/322 |
| 2005/0202351 A1* | 9/2005 | Houlihan et al. | 430/322 |
| 2006/0141400 A1* | 6/2006 | Hirayama et al. | 430/395 |

FOREIGN PATENT DOCUMENTS

| | | |
|---|---|---|
| JP | 7-253674 | 10/1995 |
| JP | 11-176727 | 7/1999 |
| JP | 11-352697 | 12/1999 |
| JP | 2000-206694 | 7/2000 |
| JP | 2000-338674 | 12/2000 |
| JP | 2001-183836 | 7/2001 |
| JP | 2002-145962 | 5/2002 |
| JP | 2002-234916 | 8/2002 |
| JP | 2002-268226 | 9/2002 |
| JP | 2002-303980 | 10/2002 |
| JP | 2002-338634 | 11/2002 |
| JP | 2002-543469 | 12/2002 |
| JP | 2003-2925 | 1/2003 |
| WO | 99/49504 | 9/1999 |
| WO | 00/67072 | 11/2000 |
| WO | 02/064648 A1 | 8/2002 |
| WO | 02/065212 A1 | 8/2002 |

OTHER PUBLICATIONS

Hoffnagle, J. A. et al., "Liquid immersion deep-ultraviolet interferometric lithography", *Journal of Vacuum Science and Technology*, B 17(6), pp. 3306 to 3309 (1999).

Switkes, M. et al., "Immersion lithography at 157 nm", *Journal of Vacuum Science and Technology*, B 19(6), pp. 2353 to 2356 (2001).

Switkes, M. et al., "Resolution Enhancement of 157 nm Lithography by Liquid Immersion", *Proceedings of SPIE*, vol. 4691, pp. 459 to 465 (2002).

Kodama, Shun-ichi et al., "Synthesis of Novel Fluoropolymer for 157 nm Photoresists by Cyclo-polymerization", Proceedings of SPIE, vol. 4690, pp. 76 to 83 (2002).

* cited by examiner

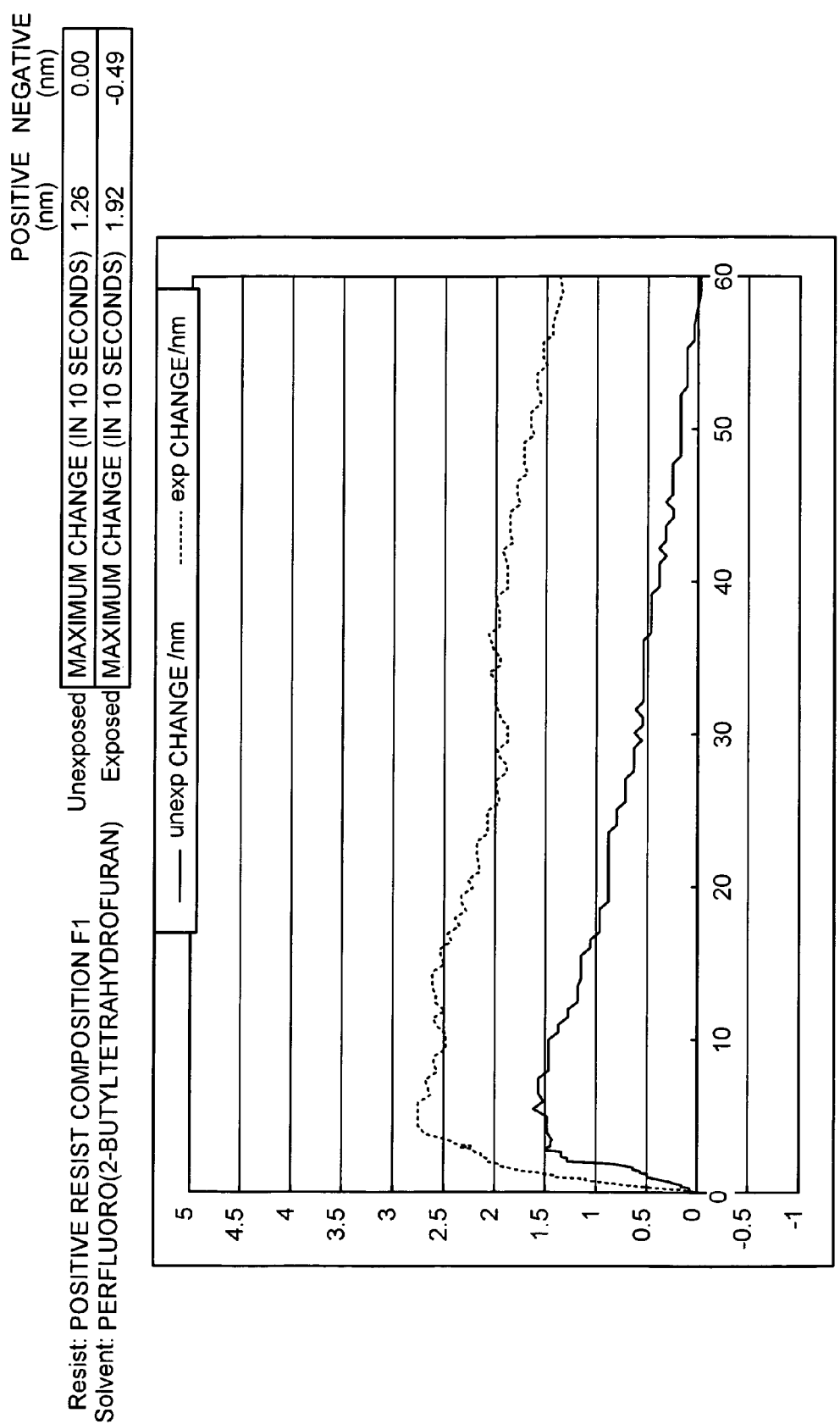

US 7,264,918 B2

RESIST COMPOSITION FOR LIQUID IMMERSION EXPOSURE PROCESS AND METHOD OF FORMING RESIST PATTERN THEREWITH

TECHNICAL FIELD

The present invention relates to a resist composition which is advantageously used for obtaining a resist film for use in a liquid immersion lithography process, especially in a liquid immersion lithography process in which a resist film is exposed through a liquid having a predetermined thickness and having a refractive index higher than that of air where the liquid is present at least on the resist film in a path of the lithographic exposure light toward the resist film, which process achieves an improved resolution of resist pattern, as compared to a general lithography process, and a method for forming a resist pattern using the resist composition.

BACKGROUND ART

In the manufacturing of a variety of electronic devices, such as semiconductor devices and liquid crystal devices, having microstructures, a lithography method is widely used, and as the device structures are miniaturized, resist patterns in the lithography process are desired to be miniaturized.

Currently, in a state-of-the-art lithography technique, for example, a fine resist pattern having a line width as small as 90 nm can be formed by a lithography method, and the formation of a further finer pattern will be needed in the future.

For achieving the formation of such a fine pattern that is smaller than 90 nm, the development of an improved exposure system and the corresponding resist is the most important. The improvement of the exposure system generally consists of the development of a light source, such as an $F_2$ laser, an EUV (extreme ultraviolet) light, an electron beam, or an X-ray, having a shorter wavelength and the development of a lens having an increased numerical aperture (NA).

However, the light source having a shorter wavelength has a problem in that it requires a new expensive exposure system, and the increase of NA has a problem in that there is a trade-off between the resolution and the depth of focus and the increase of the resolution lowers the depth of focus.

Recently, as a lithography technique which can solve the problems, a liquid immersion lithography method has been reported (For example, Non-patent document 1 (Journal of Vacuum Science & Technology B (J. Vac. Sci. Technol. B) (Published in the United States) 1999, Vol. 17, 6th number, pp. 3306-3309), Non-patent document 2 (Journal of Vacuum Science & Technology B (J. Vac. Sci. Technol. B) (Published in the United States) 2001, Vol. 19, No. 6, pp. 2353-2356), and Non-patent document 3 (Proceedings of SPIE Vol. 4691 (Published in the United States) 2002, Vol. 4691, pp. 459-465)). This method is such that a resist film is exposed through a liquid refractive index medium (immersion liquid), such as pure water or a fluorine-based inert liquid, having a predetermined thickness at least on the resist film between a lens and the resist film on a substrate. In this method, the space of the path of exposure light, which has conventionally been filled with inert gas, such as air or nitrogen gas, is replaced by a liquid having a larger refractive index (n), for example, pure water, and therefore, the use of a light source having a wavelength for the exposure conventionally used can achieve high resolution without lowering the depth of focus like the use of a light source having a shorter wavelength or a lens having a higher NA.

By employing the liquid immersion lithography, a resist pattern having higher resolution and excellent depth of focus can be formed at a low cost using a lens mounted on the existing exposure system, and hence the liquid immersion lithography has attracted considerable attention.

DISCLOSURE OF THE INVENTION

With respect to the manufacturing of semiconductor devices, which requires large facility investment, the advantage of the immersion lithography aforementioned is expected to have a considerable effect on the semiconductor industry from the viewpoints of the reduction of cost and the improvement of lithography properties including resolution. However, the resist layer is in contact with the immersion liquid during the exposure as mentioned above, and therefore the immersion lithography has problems in that the resist layer changes in properties, or an ingredient of the resist, which adversely affects the immersion liquid, is dissolved in the immersion liquid to change the refractive index of the immersion liquid, so that the inherent advantage of the immersion lithography is not exhibited, and thus it is still unclear whether the immersion lithography can surely form a resist pattern as good as the resist pattern formed by the normal exposure process conventionally used.

Actually, the Non-patent document 2 and the Non-patent document 3 have reported a liquid immersion lithography process at 157 nm, but a conventional KrF resist or ArF resist is used and patterning of an $F_2$ resist is not carried out. The present applicant used the conventional resist for KrF or resist composition for ArF in the immersion lithography, and as a result, it has been found that there are problems in that the immersion liquid causes the sensitivity deterioration or the suffering resist pattern surface roughening (profile deterioration), for example, causes the resist pattern having a T-top form, or the immersion liquid causes the resist pattern swelling.

The present invention has been achieved in view of the above problems accompanying the conventional technique, and an object of the present invention is to provide a resist composition which is advantageously used for obtaining a resist film for use in a liquid immersion lithography process wherein the resist composition has excellent sensitivity and excellent resist pattern profile and does not lower the improved resolution and depth of focus, which are the advantage of the immersion lithography, and the resist composition is unlikely to be adversely affected by the immersion liquid used in the immersion lithography step, and a method for forming a resist pattern using the resist composition.

The present inventors have made extensive studies with a view to solving the above problems. Accordingly, it has been found that the method described below solves the problems, and the present invention has been completed.

Specifically, a first aspect of the present invention relates to a resist composition for liquid immersion lithography process, and it is characterized in that a coating film formed using the resist composition, which is unexposed, and a coating film formed using the resist composition, which is exposed, individually have the maximum increase in thickness equal to or less than 3.0 nm as measured by a method in which the unexposed or exposed coating film is immersed in a fluorine-based liquid and then a change of the thickness of the coating film immersed in the liquid is measured by a quartz crystal oscillator method for 10 seconds from the start of the measurement.

The resist composition for use in a liquid immersion lithography process according to a second aspect of the present invention is a liquid immersion lithography process to be preferably used in a liquid immersion lithography process in which a resist film is exposed through a liquid, which is characterized in that the absolute value of $[(X2/X1)-1]\times 100$ is equal to or less than 8.0 wherein X1 represents a sensitivity with which a resist pattern having a 110 nm line and space of 1:1 is formed by a normal exposure lithography process using a light source having a wavelength of 157 nm, and X2 represents a sensitivity with which a resist pattern having a 110 nm line and space of 1:1 is formed by the liquid immersion lithography process using the light source of 157 nm.

A third aspect of the present invention more concretely specifies the liquid immersion lithography processes according to the first and the second aspects described above and it comprises (A) a polymer including (a1) alkali-soluble constitutional units each comprising an alicyclic group having both (i) a fluorine atom or a fluoroalkyl group and (ii) an alcoholic hydroxyl group, wherein the polymer changes in alkali-solubility due to the action of acid; and (B) an acid generator which generates acid due to exposure to light.

A fourth aspect of the present invention relates to a method for forming a resist pattern using a liquid immersion lithography process, which comprises forming a resist film on a substrate using at least any of the resist compositions described above, applying a liquid directly onto the resist film, selectively exposing the resist film through the liquid, subjecting the resultant resist film to post exposure bake treatment, and subjecting the resist film to development, thus forming a resist pattern.

A fifth aspect of the present invention relates to a method for forming a resist pattern using a liquid immersion lithography process, which comprises forming a resist film on a substrate using at least any of the resist compositions described above, forming a protective film on the resist film, applying a liquid directly onto the protective film, selectively exposing the resist film through the liquid and the protective film, subjecting the resultant resist film to post exposure bake treatment, and subjecting the resist film to development, thus forming a resist pattern.

In the above configuration, it is preferable that the liquid immersion lithography process is a process in which the resist film is exposed through a liquid (immersion liquid) having a predetermined thickness and having a refractive index larger than that of air, wherein the liquid is present at least on the resist film in a path of the lithographic exposure light toward the resist film, which process improves the resolution of resist pattern.

With respect to the method for evaluating the suitability of the resist film used in the liquid immersion lithography process in the present invention, the present inventors have made an analysis as shown below, and based on the results of the analysis, the resist composition and the method for forming a resist pattern using the resist composition were evaluated.

Specifically, for evaluating the formation of a resist pattern by the liquid immersion lithography, it is considered to be necessary and sufficient to confirm three points, i.e., (i) the performance of the optical system in the liquid immersion lithography process, (ii) the effect of the resist film on the immersion liquid, and (iii) the change of properties of the resist film due to the immersion liquid.

With respect to (i) the performance of the optical system, for example, as is apparent from the case where a photographic sensitive plate having a surface resistant to water is immersed in water and the surface of the plate is irradiated with a pattern light, there occurs no problem in principle when a light transmission loss, such as reflection, is not caused at the water surface and the interface between the water and the surface of the sensitive plate. The light transmission loss in this case can be easily removed by optimizing the angle of incidence of the exposure light. Thus, it is considered that any objects of the exposure, for example, a resist film, a photographic sensitive plate, and an image screen, which are inert to the immersion liquid, namely, which are not affected by the immersion liquid, and which do not affect the immersion liquid, cause no change of the performance of the optical system. Therefore, a check test for this point is not required.

(ii) The effect of the resist film on the immersion liquid specifically indicates that the component of the resist film is dissolved in the immersion liquid to change the refractive index of the liquid. Theoretically, when the refractive index of the immersion liquid changes, the optical resolution of the pattern exposure is sure to change, and experiments are not necessary. In this point, it is enough to simply check whether the component of the resist film immersed in a liquid is dissolved in the liquid to change the formulation or refractive index of the immersion liquid, and it is not necessary to check the resolution by actual irradiation of a pattern light and development.

Conversely, when the resist film immersed in the liquid is irradiated with a pattern light and developed to check the resolution, it is possible to know as to whether the resolution is excellent or poor, but it is difficult to judge whether the resolution is affected by the change of properties of the immersion liquid or the change of properties of the resist material or both.

With respect to the phenomenon in which the resolution is lowered by (iii) the change of properties of the resist film due to the immersion liquid, an evaluation test such that "the resist film after the exposure is showered with the immersion liquid and then developed, and the resultant resist pattern is examined in respect of the resolution" is satisfactory. In this evaluation method, the resist film is directly showered with the liquid, and hence the conditions for immersion are very stringent. In this point, by the test in which the resist film completely immersed in the liquid is exposed, it is difficult to judge whether the resolution is changed by the change of properties of the immersion liquid, the change of properties of the resist composition due to the immersion liquid, or both.

The phenomena (ii) and (iii) are inextricably linked with each other, and can be grasped by merely checking the change of properties of the resist film due to the immersion liquid. In other words, checking the point (iii) achieves checking the point (ii) simultaneously.

Based on the results of the analysis, the suitability for liquid immersion lithography of the resist film formed from a new resist composition advantageously used in the liquid immersion lithography process was evaluated by an evaluation test (hereinafter, referred to as "evaluation test 1") in which "between the selective exposure and the post exposure bake (PEB), the resist film is brought into contact with the immersion liquid, for example, a shower of the liquid, and then developed, and the resultant resist pattern is examined in respect of the resolution". Furthermore, as another evaluation method corresponding to the advanced method of the evaluation test 1, an evaluation test (hereinafter, referred to as "evaluation test 2") using "a method comprising, using an interfered light caused by a prism as a pattern light for exposure, subjecting a sample immersed in a liquid to exposure (two-beam interferometry exposure method)", which simulates the practical production process, was employed as an evaluation test in the present invention. Furthermore, the relationship between the resist film and the immersion solvent was examined by an evaluation test (hereinafter, referred to as "evaluation test 3") using a quartz crystal oscillator method (method for film thickness measurement in which a thickness is detected according to the change of a weight by a quartz crystal microbalance) as a method for measuring a very slight change of the thickness of a film. The suitability for liquid immersion lithography of the resist film can be evaluated by the three types of evaluation tests, but further it was confirmed that a resist pattern was actually formed by the contact exposure in the immersed state, and the experiments are shown in the working Examples below.

As mentioned above, by the resist composition for liquid immersion lithography process and the method for forming a resist pattern of the present invention, the exposure and development by a liquid immersion lithography process using an $F_2$ excimer laser having a wavelength of 157 nm as a light source can form an ultrafine pattern having excellent form stability, which has not been achieved conventionally.

BRIEF DESCRIPTION OF DRAWINGS

FIG. 2 is another graph of a change of the thickness of a resist film against the immersion time.

BEST MODE(S) FOR CARRYING OUT THE INVENTION

Figure 1:
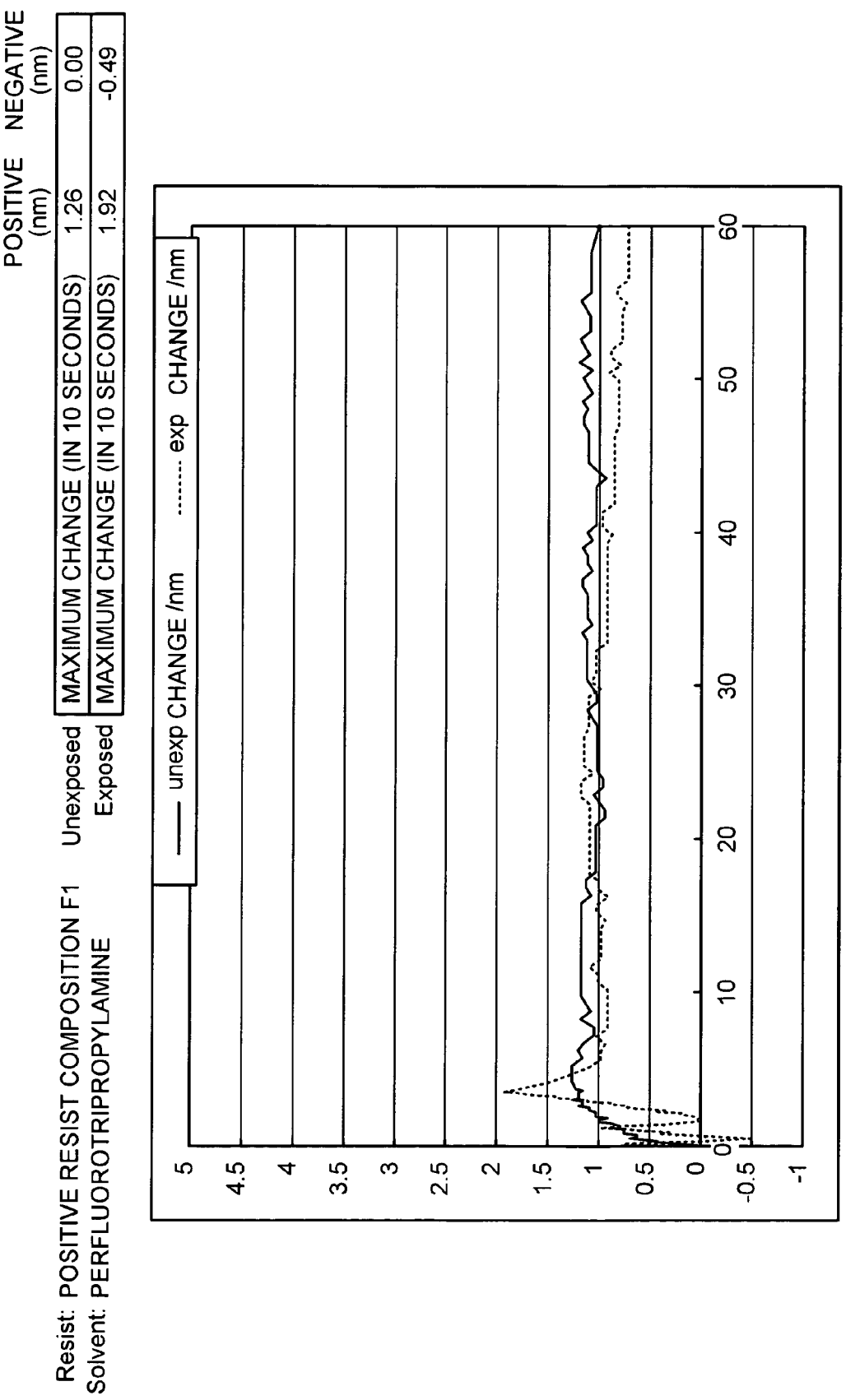
FIG. 1 is a graph of a change of the thickness of a resist film against the immersion time.

As described above, the first aspect of the present invention relates to a resist composition for liquid immersion lithography process, and it is characterized in that a coating film formed using the resist composition, which is unexposed, and a coating film formed using the resist composition, which is exposed, individually have the maximum increase in thickness equal to or less than 3.0 nm as measured by a method in which the unexposed or exposed coating film is immersed in a fluorine-based liquid and then a change of the thickness of the coating film immersed in the liquid is measured by a quartz crystal oscillator method for 10 seconds from the start of the measurement.

As is apparent from the Examples and Comparative Examples shown below and the graphs (FIGS. 1 and 2), the resist composition in which the maximum increase in thickness is equal to or less than 3.0 nm is extremely preferable as a resist composition for immersion lithography process, and has advantages in that it is unlikely to be adversely affected by the solvent used in the immersion lithography step and is excellent in sensitivity and resist pattern profile. The maximum increase in thickness close to 0 is advantageous to the immersion lithography.

The first aspect of the present invention will be described in more detail in the order of the procedure of measurement of the film thickness.

The "coating film formed using the resist composition" means a coating film formed by applying the resist composition to a substrate, such as a silicon wafer, for example, by a spin coating method so that the resultant film has a predetermined thickness, and drying it. The term "drying" used here means to heat the solvent in the resist composition to permit it to volatilize, which is the same as prebake in the lithography process. With respect to the predetermined thickness of the film, there is no particular limitation, but the evaluation in the Examples employed a thickness of 150 nm.

The coating film then unexposed or exposed is immersed in a fluorine-based liquid. This is conducted for observing a change of the thickness of the film due to the effect of the fluorine-based liquid on the exposed portion or unexposed portion.

As a light source, a light source suitable for the respective resists is used. For example, a KrF excimer laser (248 nm) is used for a resist for KrF, an ArF excimer laser (193 nm) is used for a resist for ArF, and an $F_2$ excimer laser (157 nm) is used for a resist for $F_2$. With respect to the exposure energy, there is no particular limitation, but as a index, exposure energy as small as possible in a lithography method may be used such that a resist film of a large area, which can be visually recognized, is exposed and developed and the resist film of large area disappears by the development so that the substrate can be seen.

The substrate having formed thereon a coating film having the exposed portion and the substrate having formed thereon a coating film having the unexposed portion are then individually immersed in a fluorine-based liquid, and a change of the thickness of each coating film immersed in the liquid is measured by a quartz crystal oscillator method.

The quartz crystal oscillator method is for measuring a film thickness using a known quartz crystal microbalance. This method makes it possible to measure a slight change in the order of nm of the thickness of the resist film at the exposed portion and unexposed portion in the fluorine medium. In the present invention, as an apparatus for the measurement, "RDA-QZ3", manufactured by Litho Tech Japan Co., Ltd., was used.

As seen from the whole of the Examples and Comparative Examples shown below, the resist unsatisfactory as a resist composition for immersion lithography process, in which at least one of the exposed coating film and the unexposed coating film, that is, any one of the exposed and unexposed coating films or both have the maximum increase in thickness of more than 3.0 nm in 10 seconds from the start of the measurement, is unsuitable for the liquid immersion lithography process.

By contrast, in the resist according to the first aspect in which both the exposed and unexposed coating films have the maximum increase in thickness equal to or less than 3.0 nm in 10 seconds from the start of the measurement, it has been confirmed that a 65 nm pattern is formed as the finest resist pattern.

The reason for the use of a time of 10 seconds from the start of the measurement resides in that the time required for the practical liquid immersion lithography process is shorter than 10 seconds and hence observation of the behavior in the measurement for 10 seconds is satisfactory. The observation of the behavior in the measurement for a period of time longer than 10 seconds, which is far from the time for the liquid immersion process, causes a meaningless result.

The maximum increase in thickness equal to or less than 3.0 nm means as follows. With respect to each of the exposed coating film and the unexposed coating film, an immersion time is taken as the abscissa and a change of the thickness is taken as the ordinate to draw a graph, which leads to an easy understanding of the term. The term means that the maximum increase in thickness in the graph of each of the exposed and unexposed coating films is equal to or less than 3.0 nm.

The increase in thickness can be seen from a point in the graph positioned above 0 as a reference, and conversely, the decrease in thickness can be seen from a point in the graph positioned under 0.

With respect to the graph, it is more preferable that a graph is obtained in which the increase or decrease in thickness of each of the exposed coating film and the unexposed coating film is small, which graph is as horizontal as possible relative to the time axis, that is, the increase or decrease in thickness of each of the exposed coating film and the unexposed coating film is equal to or less than 2.0 nm for 20 seconds, preferably 60 seconds from the start of the measurement.

The resist composition for use in a liquid immersion lithography process according to the second aspect of the present invention is a liquid immersion lithography process to be used in a liquid immersion lithography process in which a resist film is exposed through a liquid, which is characterized in that the absolute value of $[(X2/X1)-1]\times 100$ is equal to or less than 8.0 wherein X1 represents a sensitivity with which a resist pattern having a 110 nm line and space of 1:1 is formed by a normal exposure lithography process using a light source having a wavelength of 157 nm, and X2 represents a sensitivity with which a resist pattern having a 110 nm line and space of 1:1 is formed by the liquid immersion lithography process using the light source of 157 nm. The absolute value is more preferably equal to or less than 5, still more preferably equal to or less than 3, and the most preferably extremely close to 0.

As described in "Means for Solving Problems", the present inventors have found that, from the results of the evaluation test 1, the evaluation test 2, and the evaluation test 3, generally, the resist composition having the maximum increase in thickness defined in the first aspect or having the absolute value defined in the second aspect is extremely preferable as a resist composition for immersion lithography process, and has advantages in that it is unlikely to be adversely affected by the solvent used in the immersion lithography step and is excellent in sensitivity and resist pattern profile.

In addition, as shown in Example 16 mentioned below, the present inventors actually formed a resist pattern by a method in which the coating film formed using the resist composition was immersed in an immersion liquid, and then the coating film immersed in the liquid was subjected to contact exposure lithography through a mask for exposure in contact with the immersion liquid using a light source having a wavelength of 157 nm to form a resist pattern, thus confirming that a pattern of the mask form for exposure was formed.

In the second aspect of the present invention, the "normal exposure lithography process using a light source having a wavelength of 157 nm" means a process in which exposure is conducted using an $F_2$ excimer laser having a wavelength of 157 nm as a light source in a state such that a space between a lens of an exposure system and a resist film on a wafer is filled with inert gas, such as air or nitrogen gas, as conventionally commonly conducted, and a substrate, such as a silicon wafer, is subjected to general lithography process, namely, successively subjected to resist coating, prebake, selective exposure, post exposure bake, and alkaline development. The process can comprise a post-bake step after the alkaline development. An organic or inorganic antireflection coating film can be formed between the substrate and the coating layer of the resist composition. The sensitivity X1 with which a resist pattern having a 110 nm line and space of 1:1 (hereinafter, referred to as "110 nm L&S") is formed by the normal exposure lithography process means exposure energy at which the 110 nm L&S is formed, which is an obvious technical index frequently used by those skilled in the art.

For reference, the sensitivity is described below.

First, exposure energy is taken as the abscissa and a resist line width formed at the exposure energy is taken as the ordinate, and a logarithmic approximation curve is obtained from the resultant plot by a method of least squares. The curve is given by the formula: $Y=a\,\mathrm{Log}\,e(X1)+b$ wherein X1 represents exposure energy, Y represents a resist line width, and each of a and b represents a constant. This formula is converted to $X1=\mathrm{Exp}[(Y-b)/a]$ to represent X1. Y=130 (nm) is applied to the formula for X1 to obtain an arithmetically ideal sensitivity X1.

The conditions, that is, the number of revolutions of the resist coating, the prebake temperature, the exposure conditions, the post exposure bake conditions, and the alkaline development conditions may be conditions conventionally commonly used such that a 110 nm line and space can be formed, which are obvious. Specifically, the number of revolutions is about 1,200 to 3,500 rpm, more specifically about 2,000 rpm, and the prebake temperature is in the range of from 70 to 130° C., thus forming a resist film having a thickness of 80 to 250 nm (the temperature at which the 110 nm line and space becomes 1:1 is obvious to those skilled in the art and hence the temperature is arbitrarily selected in the range). Exposure conditions may be such that exposure is conducted through a mask using an exposure system which can emit an $F_2$ excimer laser having a wavelength of 157 nm and which is suitable for the production of electronic devices, such as semiconductor devices, specifically an $F_2$ excimer laser exposure system, manufactured by Exitech Ltd. (NA=0.85, σ=0.3). As a mask in the selective exposure, a general binary mask is used. As the mask, a phase-shifting mask may be used, but in such a case, the mask has a pattern which forms a resist pattern having a 90 nm line and space of 1:1. The post exposure bake temperature is in the range of from 90 to 140° C., and alkaline development conditions are such that development is conducted using a 2.38 wt % TMAH (tetramethylammonium hydroxide) developer solution at 23° C. for 15 to 90 seconds, followed by rinsing with water.

Furthermore, in the second aspect of the present invention, the wording "the liquid immersion lithography process using the light source of 157 nm" means a liquid immersion lithography process corresponding to the normal exposure lithography process using an $F_2$ excimer laser of 157 nm as a light source, which further comprises, between the selective exposure and the post exposure bake (PEB), a step of bringing the resist film into contact with an immersion liquid.

Specifically, the liquid immersion lithography process is a process in which resist coating, prebake, selective exposure, a step of bringing the resist film into contact with a liquid for immersion lithography (immersion liquid), post exposure bake, and alkaline development are successively carried out. The process optionally comprises a post-bake step after the alkaline development.

A specific mode of bringing the resist film into contact with an immersion liquid may be either to immerse the resist film on a substrate after the selective exposure in an immersion liquid or to spray an immersion liquid against the resist film using, for example, a rinsing nozzle like showering the resist film with the liquid. The conditions for the process are entirely the same as those mentioned in connection with the normal exposure except for the step of bringing the resist film into contact with a liquid for immersion lithography.

The sensitivity X2 with which a resist pattern having a 110 nm line and space of 1:1 is formed by the liquid immersion lithography process using the light source of 157 nm means exposure energy at which the 110 nm L&S is formed like X1 above, which is a technical index generally used by those skilled in the art.

The conditions in this case (the number of revolutions of the resist coating, the prebake temperature, the exposure conditions, the post exposure bake conditions, and the alkaline development conditions) are obvious like those for X1.

In the second aspect of the present invention, it is required that the absolute value of $[(X2/X1)-1] \times 100$ is equal to or less than 8.0, and the absolute value satisfies the requirement when X2 and X1 are determined as described above. The resist composition in which the absolute value exceeds 8.0 is unsuitable for the liquid immersion lithography process, which causes a problem in that the resist pattern has a T-top form or the resist pattern collapses.

In the resist composition of the second aspect of the present invention, with respect to the formulation, there is no particular limitation, but it is preferable that the resist composition is of a chemically amplified type comprising a resin component which changes in alkali-solubility due to the action of acid and an acid generator component which generates acid due to exposure to light. Various chemically amplified resists for KrF, ArF, $F_2$, electron beam, and X-ray have been proposed, and there is no particular limitation as long as they meet the absolute value in the specific range. Especially a resist for $F_2$ is preferable.

As the resin component, one type or two or more types of alkali-soluble resins or resins which can be alkali-soluble, which are generally used as a base resin for chemically amplified resist, can be used. The former is a so-called negative resist composition, and the latter is a so-called positive resist composition.

In the negative resist composition, a cross-linking agent is incorporated together with the acid generator component. Upon forming a resist pattern, acid is generated from the acid generator component due to exposure to light, and the acid causes cross-linking between the alkali-soluble resin component and the cross-linking agent, making the resist alkali-insoluble. As the alkali-soluble resin, a resin having units derived from at least one member selected from an α-(hydroxyalkyl)acrylic acid and a lower-alkyl ester of α-(hydroxyalkyl)acrylic acid is preferable since the resin forms an excellent resist pattern unlikely to swell during the immersion lithography.

As the cross-linking agent, for example, an amino cross-linking agent generally having a methylol group or an alkoxymethyl group, particularly glycoluril having a butoxymethyl group, which is insoluble in the solvent for the immersion lithography is preferable, since an excellent resist pattern unlikely to swell during the immersion lithography can be formed. The amount of the cross-linking agent incorporated is preferably in the range of from 1 to 50 parts by weight, relative to 100 parts by weight of the alkali-soluble resin.

In the positive resist composition, the resin component is an alkali-insoluble resin having a so-called acid-dissociative dissolution inhibiting group, and when acid is generated from the acid generator component due to exposure to light, the acid causes the acid-dissociative dissolution inhibiting group to dissociate, making the resin component alkali-soluble.

With respect to the formulation of the resist composition, preferred is the formulation described below in connection with the resist composition of the third aspect of the present invention, i.e., "resist composition for liquid immersion lithography process, which comprises: (A) a polymer comprising (a1) alkali-soluble constitutional units each comprising an alicyclic group having both (i) a fluorine atom or a fluoroalkyl group and (ii) an alcoholic hydroxyl group, wherein the polymer changes in alkali-solubility due to the action of acid; and (B) an acid generator which generates acid due to exposure to light, more preferably, further comprises any one of a specific amine and a specific dissolution inhibitor or both". When the resist composition has at least this formulation, the absolute value defined in the second aspect of the present invention can advantageously be equal to or less than 8.0.

Next, the resist composition for liquid immersion lithography process of the third aspect of the present invention will be described in more detail.

As described above, the resist composition for liquid immersion lithography process according to the third aspect of the present invention is a resist composition for liquid immersion lithography process comprising (A) a polymer including (a1) alkali-soluble constitutional units each comprising an alicyclic group having both (i) a fluorine atom or a fluoroalkyl group and (ii) an alcoholic hydroxyl group, wherein the polymer changes in alkali-solubility due to the action of acid; and (B) an acid generator which generates acid due to exposure to light.

In the descriptions below, the polymer (A) and acid generator (B) as main components of the composition of the third aspect are described first.

The polymer (A), which is a base polymer in the resist composition of the present third aspect, comprises alkali-soluble constitutional units (a1) each comprising an alicyclic group having both (i) a fluorine atom or a fluoroalkyl group and (ii) an alcoholic hydroxyl group, wherein the polymer changes in alkali-solubility due to the action of acid.

The polymer (A) in the present invention is known as described in Patent document 1 (International Patent Publication No. WO 00/67072 Pamphlet), Patent document 3 (International Patent Publication No. WO 02/65212 Pamphlet), Patent document 4 (International Patent Publication No. WO 02/64648 Pamphlet), or Non-patent document 4 (S. Kodama et al., "Synthesis of Novel Fluoropolymer for 157 nm Photoresists by Cyclo-polymerization" Prodceedings of SPIE, Vol. 4690, (2002) pp 76-83). However, it has not been known whether a resist composition using this polymer is suitable for the liquid immersion lithography process. With respect to the polymer (A) in the present invention, there is no particular limitation as long as the polymer comprises alkali-soluble constitutional units (a1) each comprising an alicyclic group having both (i) a fluorine atom or a fluoroalkyl group and (ii) an alcoholic hydroxyl group, wherein the polymer changes in alkali-solubility due to the action of acid.

The wording "changes in alkali-solubility due to the action of acid" indicates a change of the polymer at the exposed portion, and when the exposed portion of the polymer increases in alkali-solubility, the exposed portion becomes alkali-soluble and hence the resist composition can be used as a positive resist, and on the other hand, when the exposed portion of the polymer decreases in alkali-solubility, the exposed portion becomes alkali-insoluble and hence the resist composition can be used as a negative resist.

The alkali-soluble constitutional units (a1) each comprising an alicyclic group having both (i) a fluorine atom or a fluoroalkyl group and (ii) an alcoholic hydroxyl group may be constitutional units having therein an alicyclic group to which an organic group having both the groups (i) and (ii) is bonded.

Examples of the alicyclic groups include groups obtained by eliminating one or a plurality of hydrogen atoms from a monocyclic or polycyclic hydrocarbon, such as cyclopentane, cyclohexane, a bicycloalkane, a tricycloalkane, or a tetracycloalkane.

Specific examples of polycyclic hydrocarbons include groups obtained by eliminating one or a plurality of hydrogen atoms from a polycycloalkane, such as adamantane, norbornane, isobornane, tricyclodecane, or tetracyclododecane.

Among them, from an industrial point of view, groups derived by eliminating a hydrogen atom(s) from cyclopentane, cyclohexane, or norbornane are preferable.

Examples of the (i) fluorine atom or fluoroalkyl groups include a fluorine atom and lower alkyl groups having part or all of their hydrogen atoms replaced by a fluorine atom or fluorine atoms. Specific examples include a trifluoromethyl group, a pentafluoroethyl group, a heptafluoropropyl group, and a nonafluorobutyl group, and preferred are a fluorine atom and a trifluoromethyl group from an industrial point of view.

The alcoholic hydroxyl group (ii) may be either merely a hydroxyl group, or an alcoholic hydroxyl group-containing alkyloxy group, an alcoholic hydroxyl group-containing alkyloxyalkyl group, or an alcoholic hydroxyl group-containing alkyl group, such as an alkyloxy group, alkyloxyalkyl group, or alkyl group having a hydroxyl group. Examples of the alkyloxy groups, alkyloxyalkyl groups, or alkyl groups include lower alkyloxy groups, lower-alkyloxy-lower-alkyl groups, and lower alkyl groups.

Specific examples of the lower alkyloxy groups include a methyloxy group, an ethyloxy group, a propyloxy group, and a butyloxy group, specific examples of the lower-alkyloxy-lower-alkyl groups include a methyloxymethyl group, an ethyloxymethyl group, a propyloxymethyl group, and a butyloxymethyl group, and specific examples of the lower alkyl groups include a methyl group, an ethyl group, a propyl group, and a butyl group.

In the alcoholic hydroxyl group-containing alkyloxy group, alcoholic hydroxyl group-containing alkyloxyalkyl group, or alcoholic hydroxyl group-containing alkyl group (ii), the alkyloxy group, alkyloxyalkyl group, or alkyl group may have part or all of its hydrogen atoms replaced by a fluorine atom or fluorine atoms.

It is preferable that the alcoholic hydroxyl group-containing alkyloxy group or the alcoholic hydroxyl group-containing alkyloxyalkyl group has part of the hydrogen atoms in its alkyloxy portion replaced by a fluorine atom or fluorine atoms, or the alcoholic hydroxyl group-containing alkyl group has part of the hydrogen atoms in the alkyl group replaced by a fluorine atom or fluorine atoms, that is, preferred examples include an alcoholic hydroxyl group-containing fluoroalkyloxy group, an alcoholic hydroxyl group-containing fluoroalkyloxyalkyl group, and an alcoholic hydroxyl group-containing fluoroalkyl group.

Examples of the alcoholic hydroxyl group-containing fluoroalkyloxy groups include a (HO)C(CF$_3$)$_2$CH$_2$O-group, a 2-bis(hexafluoromethyl)-2-hydroxyethyloxy group, a (HO)C(CF$_3$)$_2$CH$_2$CH$_2$O-group, and a 3-bis (hexafluoromethyl)-3-hydroxypropyloxy group, examples of the alcoholic hydroxyl group-containing fluoroalkyloxyalkyl groups include a (HO)C(CF$_3$)$_2$CH$_2$O—CH$_2$-group and a (HO)C(CF$_3$)$_2$CH$_2$CH$_2$O—CH$_2$-group, and examples of the alcoholic hydroxyl group-containing fluoroalkyl groups include a (HO)C(CF$_3$)$_2$CH$_2$-group, a 2-bis(hexafluoromethyl)-2-hydroxyethyl group, a (HO)C(CF$_3$)$_2$CH$_2$CH$_2$-group, and a 3-bis (hexafluoromethyl)-3-hydroxypropyl group.

The groups (i) and (ii) may be directly bonded to the alicyclic group. Especially preferred constitutional units (a1) are units represented by the general formula (9) below, in which the alcoholic hydroxyl group-containing fluoroalkyloxy group, the alcoholic hydroxyl group-containing fluoroalkyloxyalkyl group, or the alcoholic hydroxyl group-containing fluoroalkyl group is bonded to a norbornene ring, wherein the units result from cleavage of the double bond in the norbornene ring since the polymer achieves excellent transparency and excellent alkali-solubility as well as excellent resistance to dry etching and is easily industrially available.

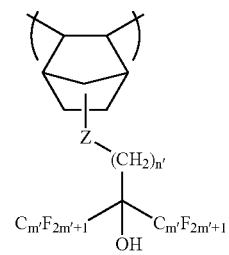

(9)

(wherein Z represents an oxygen atom, an oxymethylene group (—O(CH$_2$)—), or a single bond, and each of n' and m' is independently an integer of 1 to 5).

With respect to the polymer units to be used in combination with the units (a1), there is no particular limitation as long as they have been known. When the resin composition is used as a positive type such that the polymer (A-1) increases in alkali-solubility due to the action of acid, constitutional units (a2) derived from a known (meth)acrylic ester having an acid-dissociative dissolution inhibiting group are preferable since the resolution is excellent.

Examples of constitutional units (a2) include constitutional units derived from a tertiary alkyl ester of (meth) acrylic acid, such as tert-butyl (meth)acrylate or tert-amyl (meth)acrylate.

The polymer (A) in the present invention may be a polymer (A-2) which further comprises fluoroalkylene constitutional units (a3) for improving the polymer in transparency, and which increases in alkali-solubility due to the action of acid. The polymer containing the constitutional units (a3) is further improved in transparency. As the constitutional units (a3), units derived from tetrafluoroethylene are preferable.

The general formulae (10) and (11) respectively representing the polymer (A-1) and polymer (A-2) are shown below.

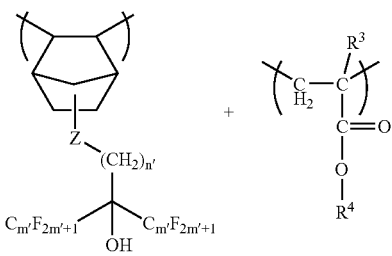

(10)

(wherein Z, n', and m' are the same as defined in the general formula (9), $R^3$ represents a hydrogen atom or a methyl group, and $R^4$ represents an acid-dissociative dissolution inhibiting group).

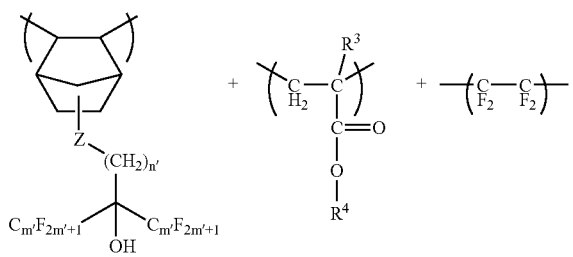

(11)

(wherein Z, n', m', $R^3$, and $R^4$ are the same as defined in the general formula (10)).

The polymer (A-1) and polymer (A-2) containing the general formula (9) have different structural formulae, but they may have the constitutional units mentioned below involved in the polymer which comprises alkali-soluble constitutional units (a1) each comprising an alicyclic group having both (i) a fluorine atom or a fluoroalkyl group and (ii) an alcoholic hydroxyl group wherein the polymer changes in alkali-solubility due to the action of acid.

Specifically, in the constitutional units (a1), the fluorine atom or fluoroalkyl group (i) and the alcoholic hydroxyl group (ii) are individually bonded to the alicyclic group wherein the alicyclic group constitutes a principal chain.

As examples of the (i) fluorine atom or fluoroalkyl groups, there can be mentioned those stated above. The alcoholic hydroxyl group (ii) is merely a hydroxyl group.

The polymer (A) having such units is described in the Patent document 3 or 4, or the Non-patent document 4, and is formed by cyclopolymerization of a diene compound having a hydroxyl group and a fluorine atom. As the diene compound, preferred is heptadiene which easily forms a polymer having a 5-membered ring or 6-membered ring and having excellent transparency and excellent resistance to dry etching, and from an industrial point of view, the most preferred is a polymer formed by cyclopolymerization of 1,1,2,3,3-pentafluoro-4-trifluoromethyl-4-hydroxy-1,6-heptadiene ($CF_2$=$CFCF_2C(CF_3)(OH)CH_2CH$=$CH_2$).

When the resin composition is used as a positive type such that the polymer (A-3) increases in alkali-solubility due to the action of acid, the polymer further comprising constitutional units (a4) obtained by replacing the hydrogen atom of the alcoholic hydroxyl group with an acid-dissociative dissolution inhibiting group is preferable. As the acid-dissociative dissolution inhibiting group, a linear, branched, or cyclic alkyloxymethyl group having 1 to 15 carbon atoms is preferable from the viewpoint of acid-dissociation, and especially preferred is a lower alkoxymethyl group, such as a methoxymethyl group, which is superior in the resolution and the pattern form. From the viewpoint of obtaining excellent pattern formability, it is preferable that the amount of the acid-dissociative dissolution inhibiting group is in the range of from 10 to 40%, preferably 15 to 30%, based on the whole hydroxyl groups.

The general formula (12) representing the polymer (A-3) is shown below.

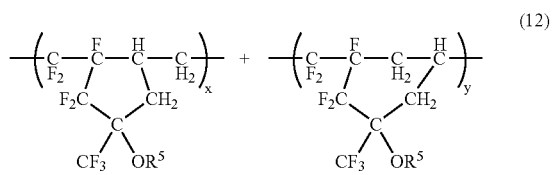

(12)

(wherein $R^5$ represents a hydrogen atom or a C1-C15 alkyloxymethyl group, and each of x and y is 10 to 50 mol %).

The polymer (A) can be synthesized by a known method, for example, the method described in the Patent document 1, 3, or 4 or the Non-patent document 4. With respect to the mass average molecular weight of the resin in the component (A) as measured by GPC using standard polystyrene for molecular weight calibration, there is no particular limitation, but the mass average molecular weight is preferably 5000 to 80000, further preferably 8000 to 50000.

The polymer (A) may be comprised of one type of a resin or two types or more of resins, for example, a mixture of two or more resins selected from the (A-1), (A-2), and (A-3), and may further contain another resin conventionally known for photoresist composition.

Acid Generator (B):

As the acid generator (B), one which is arbitrarily appropriately selected from acid generators conventionally known for the positive or negative chemically amplified resists can be used. Various acid generators have been proposed, and especially preferred are onium salts, such as diphenyliodonium trifluoromethanesulfonate, (4-methoxyphenyl)phenyliodonium trifluoromethanesulfonate, bis(p-tert-butylphenyl)iodonium trifluoromethanesulfonate, triphenylsulfonium trifluoromethanesulfonate, (4-methoxyphenyl)diphenylsulfonium trifluoromethanesulfonate, (4-methylphenyl)diphenylsulfonium nonafluorobutanesulfonate, (p-tert-butylphenyl)diphenylsulfonium trifluoromethanesulfonate, diphenyliodonium nonafluorobutanesulfonate, bis(p-tert-butylphenyl)iodonium nonafluorobutanesulfonate, and triphenylsulfonium nonafluorobutanesulfonate. Among these, preferred are sulfonium salts comprising a fluoroalkylsulfonic acid ion as anion since they have appropriate acid strength and diffusion properties in the resist film.

The acid generators (B) may be used individually or in combination. The amount of the acid generator incorporated is, for example, 0.5 to 30 parts by mass, relative to 100 parts by mass of the component (A). When the amount is smaller than this range, the formation of a latent image may be unsatisfactory, and when the amount is larger, the storage stability of the resist composition may be poor.

Next, the nitrogen-containing compound (C) and dissolution inhibitor (C') having a fluorine atom optionally added to the resist composition of the third aspect of the present invention are described.

Nitrogen-Containing Compound (C):

It has been known that a nitrogen-containing compound is incorporated in a small amount as an acid diffusion-preventing agent into the chemically amplified resist composition as described in Patent document 2 (Japanese Patent Application Laid-open No. 2003-2925 Publication).

In the present invention, such a known nitrogen-containing compound can be added. Examples of the nitrogen-containing compounds include amines and ammonium salts.

Examples of amines include aliphatic secondary amines, such as diethylamine, dipropylamine, dibutylamine, and dipentylamine; aliphatic tertiary amines, such as trimethylamine, triethylamine, tripropylamine, tributylamine, tripentylamine, N,N-dimethylpropylamine, N-ethyl-N-methylbutylamine, trihexylamine, triheptylamine, trioctylamine, tridecanylamine, tridodecylamine, and tritetradecanylamine (wherein the three alkyl groups bonded to nitrogen in the trialkylamines may be the same or different); tertiary alkanolamines, such as N,N-dimethylmonoethanolamine, triisopropanolamine, N,N-diethylmonoethanolamine, triethanolamine, and tributanolamine; and aromatic tertiary amines, such as N,N-dimethylaniline, N,N-diethylaniline, N-ethyl-N-methylaniline, N,N-dimethyltoluidine, N-methyldiphenylamine, N-ethyldiphenylamine, N-ethyldiphenylamine, and triphenylamine.

Examples of ammonium salts include salts of quaternary alkylammonium ion, such as ammonium ion, tetramethylammonium ion, tetraethylammonium ion, tetrapropylammonium ion, tetrabutylammonium ion, or tetrapentylammonium ion, and ion of an organic carboxylic acid having a hydroxyl group, such as lactic acid.

Among them, preferred are lower tertiary alkanolamines, such as triethanolamine, triisopropanolamine, and tributanolamine, and trialkylamines having 6 to 15 carbon atoms, such as trihexylamine, triheptylamine, trioctylamine, tridecanylamine, tridodecylamine, and tritetradecanylamine since the effect of suppressing the film reduction of a fine resist pattern at the top portion is excellent.

Among them, the trialkylamines having 6 to 15 carbon atoms are the most preferable since a resist pattern having excellent squareness can be obtained in the resist pattern form equal to or smaller than 50 nm, specifically 40 to 50 nm, which is intended in the liquid immersion lithography process. The reason for this is presumed as follows. In the immersion lithography process, for example, when the immersion liquid is water, water is attached to the surface of the resist film and serves as a base, thus the base neutralizes acid generated in the resist film. Furthermore, when the immersion liquid is water or a fluorine solvent, an acid generator or amine component is dissolved in the immersion liquid from the surface of the resist film, making it difficult to obtain an excellent pattern form. In this situation, when the trialkylamine having 6 to 15 carbon atoms is used, the amine is hardly dissolved in the immersion liquid and the surface of the resist film has increased hydrophobicity (water contact angle), so that the components of the resist are inhibited from being dissolved in the liquid from the surface of the resist film, thus making it possible to obtain an excellent pattern form.

The nitrogen-containing compound (C) is generally used in an amount in the range of from 0.01 to 2 parts by mass, relative to 100 parts by mass of the polymer (A). When the amount is smaller than this range, the effect of preventing the diffusion of acid generated due to the exposure to improve the pattern form cannot be obtained, and when the amount is too large, the diffusion of acid is suppressed to an excess extent, disadvantageously lowering the so-called exposure sensitivity.

In the resist composition of the third aspect of the present invention, in addition to the components (A) and (B) or the components (A), (B), and (C), a dissolution inhibitor, which is a low-molecular weight compound that decomposes (for example, hydrolyzes) in the presence of acid and increases in alkali-solubility, may be added. The dissolution inhibitor can inhibit a developer solution from dissolving the insoluble portion after the exposure. When the development is excessive, the edge portion of the pattern top is likely to be dissolved, but by adding the dissolution inhibitor, the dissolution of the edge portion of the pattern top can be prevented, making it possible to surely obtain excellent contrast of the pattern.

With respect to the dissolution inhibitor used in the resist composition of the third aspect of the present invention, examples include compounds having at least one type of substituent having an ability to inhibit the dissolution in an alkali, and having at least one aromatic ring or aliphatic ring having a molecular weight of 200 to 500, which can dissociate to a functional group of a phenolic hydroxyl group, an alcoholic hydroxyl group, or a carboxyl group in the presence of acid. Examples of such acid-dissociative substituents include tertiary alkyl groups, tertiary alkoxycarbonyl groups, tertiary alkoxycarbonylalkyl groups, and linear or cyclic alkoxyalkyl groups.

Specific examples include tertiary alkyl groups, such as a tert-butyl group; tertiary alkoxycarbonyl groups, such as a tert-butoxycarbonyl group; tertiary alkoxycarbonylalkyl groups, such as a tert-butoxycarbonylmethyl group; linear alkoxyalkyl groups, such as a methoxymethyl group, a 1-ethoxyethyl group, and a 1-propoxyethyl group; and cyclic alkoxyalkyl groups, such as a tetrahydropyranyl group and a tetrahydrofuranyl group.

Examples of the dissolution inhibitors include compounds obtained by replacing a hydrogen atom in a carboxyl group of a bile acid, such as lithocholic acid, with a tertiary alkyl group, and the below compounds having a fluorine atom (dissolution inhibitor (C')). Especially preferred are the compounds having a fluorine atom since the pattern form is excellent.

The dissolution inhibitor (C') contains a fluorine atom, and hence advantageously further improves the transparency of the resist film to an $F_2$ excimer laser, leading to excellent resist pattern form.

Examples of acid-dissociative substituents in the dissolution inhibitor (C') include tertiary alkyl groups, tertiary alkoxycarbonyl groups, tertiary alkoxycarbonylalkyl groups, and linear or cyclic alkoxyalkyl groups.

Specific examples include tertiary alkyl groups, such as a tert-butyl group; tertiary alkoxycarbonyl groups, such as a tert-butoxycarbonyl group; tertiary alkoxycarbonylalkyl groups, such as a tert-butoxycarbonylmethyl group; and linear, branched, or cyclic alkyloxymethyl groups having 1 to 15 carbon atoms, such as a methoxymethyl group, a tert-amyloxymethyl group, and a 4-tert-butyl-cyclohexyloxymethyl group.

Examples of such compounds include compounds represented by the following general formula (1) or (2):

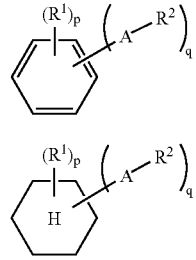

(wherein $R^1$ represents a hydrogen atom, an alkyl group, an alkoxy group, or a fluorine atom, $R^2$ represents an acid-dissociative dissolution inhibiting group, A represents a divalent organic group represented by —C($C_nF_{2n+1}$) ($C_mF_{2m+1}$)—O—CO—O—, —C($C_nF_{2+1}$) ($C_mF_{2m+1}$)—O—, or —O—CO—O—, and each of n, m, p, and q is independently an integer of 1 to 4, with the proviso that, when A is —O—CO—O—, at least one $R^1$ is replaced by a fluorine atom). By incorporating such a compound, a resist pattern having excellent squareness can be advantageously obtained in the resist pattern form equal to or smaller than 50 nm, specifically 40 to 50 nm.

Specific examples of the compounds represented by the general formula include compounds represented by the following chemical formulae (3) to (8):

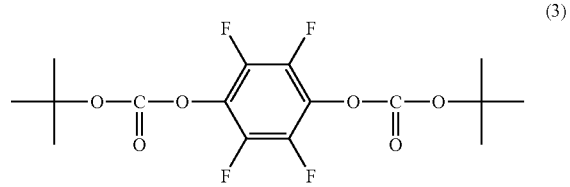

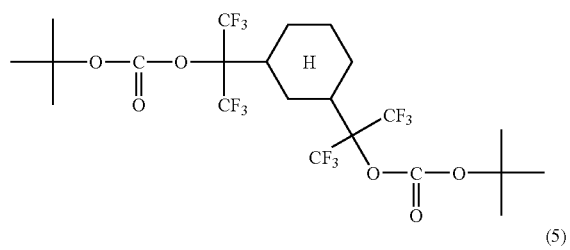

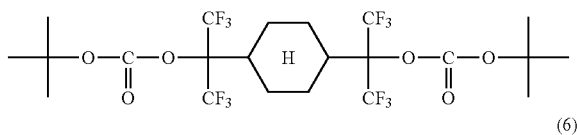

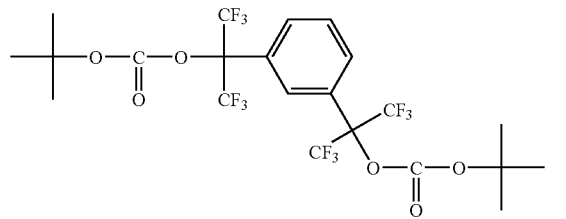

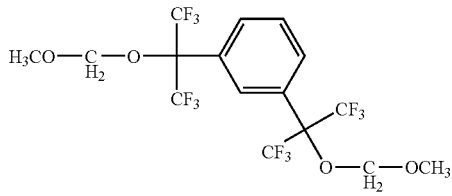

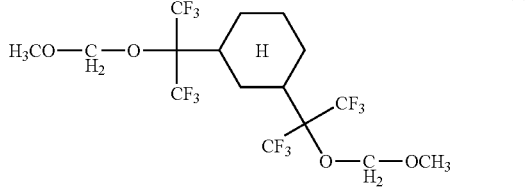

Another specific compound, for example, 3,3',5,5'-tetrafluoro[(1,1'-biphenyl)-4,4'-di-tert-butoxycarbonyl], 4,4'-[2,2,2-trifluoro-1-(trifluoromethyl)ethylidene]bisphenol-4,4'-di-tert-butoxycarbonyl, 1,1-tert-butyl 2-trifluoromethylbenzenecarboxylate, tert-butyl 2-trifluoromethylcyclohexanecarboxylate, or a compound represented by the chemical formula (13) below is used.

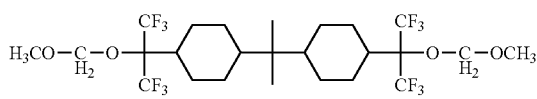

Among them, preferred are the compounds represented by the general formula (1) since they achieve high transparency and excellent fine pattern form.

The acid-dissociative dissolution inhibiting group $R^2$ is preferably a linear, branched, or cyclic alkyloxymethyl group having 1 to 15 carbon atoms or a tertiary alkyl group. Especially a compound represented by the chemical formula (6) or (7) is preferable.

In the resist composition of the third aspect of the present invention, the amount of the dissolution inhibitor added may be 2 to 30 parts by weight, preferably 3 to 10 parts by weight, relative to 100 parts by weight of the base polymer. When the amount of the dissolution inhibitor added is less than 2 parts by weight, the dissolution inhibition effect is not exhibited. On the other hand, when the amount is more than 30 parts by weight, the heat resistance of the resist is lowered.

In the present invention, for preventing the lowering of the sensitivity due to the addition of the component (C), as an optional component, an organic carboxylic acid, an oxo-acid of phosphorus, or a derivative thereof can be further added.

As the organic carboxylic acid, for example, malonic acid, citric acid, malic acid, succinic acid, benzoic acid, or salicylic acid is preferable.

Examples of the oxo-acids of phosphorus and derivatives thereof include phosphoric acid and derivatives thereof such as esters, like phosphoric acid, di-n-butyl phosphate, and diphenyl phosphate; phosphonic acid and derivatives thereof such as esters, like phosphonic acid, dimethyl phosphonate, di-n-butyl phosphonate, phenylphosphonic acid, diphenyl phosphonate, and dibenzyl phosphonate; and phosphinic acid and derivatives thereof such as esters, like phosphinic acid and phenylphosphinic acid. Among them, especially phosphonic acid is preferable. The organic carboxylic acid, oxo-acid of phosphorus, or derivative component is used in an amount of 0.01 to 5.0 parts by mass, relative to 100 parts by mass of the component (A).

The resist composition of the third aspect of the present invention is used in the form of a uniform solution obtained by dissolving the component (A), the component (B), and any one of the component (C) and the component (C') or both, and optional component(s) further added if necessary in an organic solvent. Specific examples of organic solvents include ketones, such as acetone, methyl ethyl ketone, cyclohexanone, methyl isoamyl ketone, and 2-heptanone; polyhydric alcohols and derivatives thereof, such as monomethyl ether, monoethyl ether, monopropyl ether, monobutyl ether, or monophenyl ether of ethylene glycol, ethylene glycol monoacetate, diethylene glycol, diethylene glycol monoacetate, propylene glycol, propylene glycol monoacetate, dipropylene glycol, or dipropylene glycol monoacetate; cyclic ethers, such as dioxane; and esters, such as methyl lactate, ethyl lactate, methyl acetate, ethyl acetate, butyl acetate, methyl pyruvate, ethyl pyruvate, methyl methoxypropionate, and ethyl ethoxypropionate. These organic solvents may be used individually or in the form of a mixed solvent of two or more solvents. Especially propylene glycol monomethyl ether acetate (PGMEA) and ethyl lactate (EL) are preferable.

The amount of the organic solvent is adjusted so that the resist composition has such a concentration that the composition can be applied to a substrate to form a resist film.

In the resist composition of the third aspect of the present invention, if desired, an additive miscible with the composition, for example, an additional resin for improving the performance of the resist film, or a surfactant, a plasticizer, a stabilizer, a coloring agent, or a halation preventing agent for improving the coating properties can be further added.

Examples of the immersion liquid used in the liquid immersion lithography process using the resist composition of the present invention include water comprised of pure water or deionized water, and a liquid comprised of a fluorine solvent. Particularly, when an $F_2$ excimer laser is used as a light source, a fluorine solvent is preferable since higher resolution can be obtained. The fluorine solvent preferably has a boiling point of 70 to 260° C., more preferably a boiling point of 80 to 160° C. Specific examples of the fluorine solvents include perfluoroalkyl compounds, and examples of the perfluoroalkyl compounds include perfluoroalkyl ether compounds and perfluoroalkylamine compounds.

Specific examples of the perfluoroalkyl ether compounds include perfluoro (2-butyltetrahydrofuran)(boiling point: 102° C.), and specific examples of the perfluoroalkylamine compounds include perfluorotripropylamine (boiling point: 130° C.), perfluorotributylamine (boiling point: 174° C.), perfluorotripentylamine (boiling point: 215° C.), and perfluorotrihexylamine (boiling point: 255° C.).

Next, the method for forming a resist pattern by a liquid immersion lithography process using an immersion liquid of the fourth aspect and the fifth aspect according to the present invention is described.

In the fourth aspect, the resist composition is first applied onto a substrate, such as a silicon wafer, by means of, for example, a spinner, and then subjected to prebake (PAB treatment) to form a resist film.

An organic or inorganic antireflection coating film can be formed between the substrate and the coating layer of the resist composition to form a two-layer laminate structure.

The steps can be conducted using a known method. It is preferable that the conditions for operation are appropriately selected depending on the formulation or properties of the resist composition used.

Next, the substrate having a resist film formed thereon is immersed in an immersion liquid comprised of "inert water, such as pure water or deionized water, or a fluorine solvent, such as perfluoroether" to apply the liquid directly onto the resist film.

The resist film on the substrate immersed in the liquid is selectively exposed through the liquid, that is, the resist film is exposed through a desired mask pattern. Therefore, in this case, the exposure light penetrates the immersion liquid and then reaches the resist film.

In this instance, the resist film is directly in contact with the immersion liquid, and the resist film is comprised of the resist composition of the present invention and has high resistance to the immersion liquid including water, and therefore, the resist film does not change in properties, and the immersion liquid does not change in properties due to the resist film, causing no change in optical properties, such as a refractive index.

After completion of the exposure step using the immersion liquid, the resist film exposed is subjected to PEB (post exposure bake) and subsequently subjected to development using an alkaline developer solution comprised of an alkaline aqueous solution. Post-bake may be conducted after the development treatment. Preferably, rinsing is carried out using pure water. The rinsing with water is made by, for example, allowing water to fall dropwise or spraying water against the surface of the substrate while rotating the substrate to wash away the developer solution on the substrate and the resist composition dissolved by the developer solution. Drying is then conducted to obtain a resist pattern having a form patterned in the resist film according to the mask pattern.

By the method for forming a resist pattern, a resist pattern having a fine line width, especially a line and space pattern having a small pitch can be produced with excellent resolution.

The method of the fifth aspect is for forming a resist pattern, which comprises: forming a resist film using the resist composition; forming a protective film on the resist film; applying a liquid directly onto the protective film; selectively exposing the resist film through the liquid and the protective film; subjecting the resultant resist film to post exposure bake treatment; and subjecting the resist film to development, thus forming a resist pattern, and the method is similar to the fourth aspect except for the formation of a protective film on the resist film. When the protective film described below is used, it is preferable that the protective film is removed after the post exposure bake treatment, which varies depending on the type of the protective film.

The protective film has essential properties such that the film is transparent with respect to the exposure light and incompatible with the refractive index liquid and causes no mixing with the resist film, and it has excellent adhesion to the resist film and is easily removable from the resist film. As a protective film material which can form a protective film having such properties, a composition obtained by dissolving a fluororesin in a fluorine solvent, or an aqueous solution comprising a water-soluble or alkali-soluble film-forming component is used.

As the fluororesin, for example, linear perfluoroalkyl polyether, cyclic perfluoroalkyl polyether, polychlorotrifluoroethylene, polytetrafluoroethylene, a tetrafluoroethylene-perfluoroalkoxyethylene copolymer, or a tetrafluoroethylene-hexafluoropropylene copolymer can be used.

In practice, among commercially available fluororesins, DEMNUM S-20, DEMNUM S-65, DEMNUM S-100, and DEMNUM S-200 which are linear perfluoroalkyl polyether (each manufactured by DAIKIN INDUSTRIES, Ltd.), CYTOP series which are cyclic perfluoroalkyl polyether (manufactured by ASAHI GLASS CO., LTD.), and Teflon (R)-AF1600 and Teflon (R)-AF2400 (each manufactured by DuPont) can be used.

Among the fluororesins, a mixed resin comprised of linear perfluoroalkyl polyether and cyclic perfluoroalkyl polyether is preferable.

With respect to the fluorine solvent, there is no particular limitation as long as it is a solvent which can dissolve the fluororesin, and a fluorine solvent, for example, a perfluoroalkane or perfluorocycloalkane, such as perfluorohexane or perfluoroheptane, or a perfluoroalkene having a double bond remaining in the perfluoroalkane or perfluorocycloalkane, a perfluoro cyclic ether, such as perfluorotetrahydrofuran or perfluoro(2-butyltetrahydrofuran), or perfluorotributylamine, perfluorotetrapentylamine, or perfluorotetrahexylamine can be used.

Another organic solvent compatible with the fluorine solvent or a surfactant can be appropriately selected and added.

With respect to the fluororesin concentration, there is no particular limitation as long as a film can be formed, but from the viewpoint of achieving excellent coating properties, it is preferable that the fluororesin concentration is about 0.1 to 30 wt %.

A preferred material for the protective film comprises a mixed resin comprised of linear perfluoroalkyl polyether and cyclic perfluoroalkyl polyether dissolved in perfluorotributylamine.

Examples of the water-soluble film-forming components include cellulose polymers, such as hydroxypropyl methyl cellulose phthalate, hydroxypropyl methyl cellulose acetate phthalate, hydroxypropyl methyl cellulose acetate succinate, hydroxypropyl methyl cellulose hexahydrophthalate, hydroxypropyl methyl cellulose, hydroxypropyl cellulose, hydroxyethyl cellulose, cellulose acetate hexahydrophthalate, carboxymethyl cellulose, ethyl cellulose, and methyl cellulose; acrylic acid polymers comprised of a monomer, such as N,N-dimethylacrylamide, N,N-dimethylaminopropylmethacrylamide, N,N-dimethylaminopropylacrylamide, N-methylacrylamide, diacetone acrylamide, N,N-dimethylaminoethyl methacrylate, N,N-diethylaminoethyl methacrylate, N,N-dimethylaminoethyl acrylate, acryloylmorpholine, or acrylic acid; and vinyl polymers, such as polyvinyl alcohol and polyvinylpyrrolidone. Among them, preferred are acrylic acid polymers and polyvinylpyrrolidone, which are water-soluble polymers having no hydroxyl group in their molecules, and polyvinylpyrrolidone is most preferably used. These water-soluble film-forming components may be used individually or in combination.

Examples of the alkali-soluble film-forming components include novolac resins obtained by condensing a phenol (for example, phenol, m-cresol, xylenol, or trimethylphenol) and an aldehyde (formaldehyde, a formaldehyde precursor, propionaldehyde, 2-hydroxybenzaldehyde, 3-hydroxybenzaldehyde, or 4-hydroxybenzaldehyde) and/or a ketone (for example, methyl ethyl ketone or acetone) in the presence of an acid catalyst; and hydroxystyrene resins, such as homopolymers of hydroxystyrene, copolymers of hydroxystyrene and other styrene monomers, and copolymers of hydroxystyrene and acrylic acid or methacrylic acid or a derivative thereof.

With respect to the wavelength of radiation used in the exposure in the fourth or the fifth aspect, there is no particular limitation, and radiation, such as a KrF excimer laser, an ArF excimer laser, an $F_2$ excimer laser, an EUV (extreme ultraviolet) light, a VUV (vacuum ultraviolet) light, an electron beam, a soft X-ray, or an X-ray, can be used, and especially an $F_2$ excimer laser is preferable.

EXAMPLES

Examples of the present invention will be explained below. However, the Examples merely exemplify the invention preferably, and do not limit the present invention.

In the following Examples and Comparative Examples, unless otherwise specified, conditions for the evaluation test 1 (simulated immersion lithography and sensitivity measurement) are as follows.

(1) Conditions for Forming a Resist Coating Film:
Substrate: 8-Inch silicon wafer
Method for resist application: Application using a spinner onto a substrate while rotating the substrate at 2000 rpm
Size of resist coating film: Coating film having a diameter of 6 inches and arranged in concentric circle on the substrate.
Prebake conditions: Temperature is adjusted so that the 110 nm line and space becomes 1:1.
Selective exposure conditions: Exposure using an ArF excimer laser (193 nm) [exposure system NSR-S302B (manufactured by Nikon Corporation; NA (numerical aperture)=0.60, ⅔ annular illumination)]

(2) Conditions for Contact of Resist Coating Film with Solvent
Number of revolutions of substrate: 500 rpm
Solvent: Water or fluorine solvent
Solvent fall rate: 1.0 L/minute
Solvent fall time: 2 Minutes
Temperature for contact of resist with solvent: 23° C.

(3) Conditions for Forming a Resist Pattern
Post exposure bake conditions: Temperature is adjusted so that the 110 nm line and space becomes 1:1.
Alkaline development conditions: Development using a 2.38% by mass aqueous solution of tetramethylammonium hydroxide at 23° C. for 60 seconds.

In the following Examples and Comparative Examples, specific conditions for the evaluation test 3 (method for measuring a change of the thickness of a coating film by a quartz crystal oscillator method) are as follows. Gold is deposited on one surface of a quartz substrate having a diameter of 1 inch and, while rotating the substrate at 2,000 rpm so that the gold-deposited surface is positioned on the top side, a resist composition is applied onto the gold-deposited surface by means of a spinner so that the dried coating film has a thickness of 150 nm, and dried at 90° C. for 90 seconds, and the resist is removed so that the substrate electrode is in contact with a socket electrode, and is exposed using an $F_2$ excimer laser (157 nm) (exposure system VUVES-4500 (manufactured by Litho Tech Japan Co., Ltd.)) or is not exposed, and immersed in a fluorine solvent at 23° C. and a change of the thickness of each film immersed in the fluorine solvent is measured by a quartz crystal oscillator method at an oscillation frequency of 5 MHz (megahertz).

(Resist Film 1)

As the copolymerized polymer (A) which is a main component of the resist composition of the present invention, a polymer formed by cyclopolymerization of 1,1,2,3,3-pentafluoro-4-trifluoromethyl-4-hydroxy-1,6-heptadiene ($CF_2=CFCF_2C(CF_3)(OH)CH_2CH=CH_2$) and a diene compound obtained by replacing the hydrogen atom of the hydroxyl group in the diene with a methoxymethyl group was used.

The structural formula of this polymer is shown below. The polymer had a weight average molecular weight of 40,000. The ratio of the methoxymethyl groups incorporated to the whole hydroxyl groups was 20%.

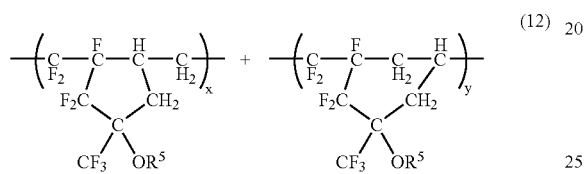

(12)

(wherein $R^5$ represents $-CH_2OCH_3$ or a hydrogen atom, and each of x and y is 50 mol %).

Relative to 100 parts by weight of the copolymerized polymer, 2 parts by weight of triphenylsulfonium nonafluorobutanesulfonate as an acid generator and 0.3 part by weight of triisopropanolamine as an amine were dissolved so that the resultant propylene glycol monomethyl ether acetate solution had a solids content of 10% by weight to obtain a resist composition in the form of a uniform solution.

On the other hand, an organic antireflection coating composition "AR-19" (trade name; manufactured by Shipley) was applied onto a silicon wafer using a spinner, and dried by calcination on a hot plate to form an organic antireflection coating film having a thickness of 82 nm. The resist composition above was then applied onto the antireflection coating film using a spinner, and dried by prebake on a hot plate at 95° C. for 90 seconds to form a resist film having a thickness of 250 nm (hereinafter, referred to as "resist film 1") on the antireflection coating film.

(Resist Film 2)

A resist composition having the same formulation as that of the resist composition used for forming resist film 1 was prepared, except that triisopropanolamine as an amine was changed to 0.6 part by weight of tridodecylamine, and a resist film (hereinafter, referred to as "resist film 2") was formed from the composition.

(Resist Film 3)

A resist composition having the same formulation as that of the resist composition used for forming resist film 1 was prepared, except that 5 parts by weight of a dissolution inhibitor of the chemical formula (6) above was further added, and a resist film (hereinafter, referred to as "resist film 3") was formed from the composition.

Reference Example 1

With respect to each of the resist films 1, 2, and 3, a resist pattern was formed by a normal exposure process.

Specifically, each resist film was selectively irradiated through a mask pattern with an ArF excimer laser (193 nm) by means of exposure system NSR-S302A (manufactured by Nikon Corporation; NA (numerical aperture)=0.60, ⅔ annular illumination). The resist film exposed was then subjected to PEB treatment under conditions at 100° C. for 90 seconds, and subjected to development using an alkaline developer solution at 23° C. for 60 seconds. As the alkaline developer solution, a 2.38% by mass aqueous solution of tetramethylammonium hydroxide was used.

Thus obtained resist patterns each having a 130 nm line and space of 1:1 were individually examined under a scanning electron microscope (SEM), and their sensitivities (Eop) were determined. Accordingly, it was found that resist films 1, 2, and 3 had excellent cross-section forms having high squareness, and had sensitivities (X1) of 20.5, 13.0, and 20.0 mJ/cm², respectively.

Example 1

With respect to each of the resist films 1, 2, and 3, a resist pattern was formed by a liquid immersion lithography process using pure water as an immersion liquid.

Specifically, each resist film was selectively irradiated through a mask pattern with an ArF excimer laser (193 nm) by means of exposure system NSR-S302A (manufactured by Nikon Corporation; NA (numerical aperture)=0.60, ⅔ annular illumination). In a simulated immersion lithography treatment, while rotating the silicon wafer having the resist film exposed, pure water at 23° C. was allowed to fall dropwise against the resist film for 2 minutes. Subsequently, the resist film was subjected to PEB treatment under conditions at 100° C. for 90 seconds, and subjected to development using an alkaline developer solution at 23° C. for 60 seconds. As the alkaline developer solution, a 2.38% by mass aqueous solution of tetramethylammonium hydroxide was used.

Thus obtained resist patterns each having a 130 nm line and space of 1:1 were individually examined under a scanning electron microscope (SEM), and their sensitivities (Eop) were determined. The resist patterns formed in resist films 1, 2, and 3 had sensitivities (X2) of 21.0, 13.5, and 20.5 mJ/cm², respectively. From the sensitivity X2 and the sensitivity X1 determined in Reference Example 1 above, it was found that, in the liquid immersion lithography process using pure water as an immersion liquid, the sensitivity ratio for resist film 1 was 2.4, the sensitivity ratio for resist film 2 was 3.8, and the sensitivity ratio for resist film 3 was 2.5. From the examination under a scanning electron microscope, it was found that the resist patterns had excellent forms such that neither a T-top form nor surface roughening were observed, especially, the resist pattern formed in resist film 2 was excellent in form stability.

Example 2

With respect to each of the resist films 1, 2, and 3, a resist pattern was formed by a liquid immersion lithography process using a fluorine compound solution (perfluoro(2-butyltetrahyrofuran) having a boiling point of 102° C. as an immersion liquid.

Specifically, each resist film was selectively irradiated through a mask pattern with an ArF excimer laser (193 nm) by means of exposure system NSR-S302A (manufactured by Nikon Corporation; NA (numerical aperture)=0.60, ⅔ annular illumination). In a simulated immersion lithography treatment, while rotating the silicon wafer having the resist film exposed, the perfluoro(2-butyltetrahydrofuran) described above at 23° C. was allowed to fall dropwise against the resist film for 2 minutes. Subsequently, the resist film was subjected to PEB treatment under conditions at 100° C. for 90 seconds, and subjected to development using an alkaline developer solution at 23° C. for 60 seconds. As the alkaline developer solution, a 2.38% by mass aqueous solution of tetramethylammonium hydroxide was used.

Thus obtained resist patterns each having a 130 nm line and space of 1:1 were individually examined under a scanning electron microscope (SEM), and their sensitivities (Eop) were determined. The resist patterns formed in the resist films 1, 2, and 3 had sensitivities (X2) of 21.0, 13.0, and 21.5 mJ/cm$^2$, respectively. From the sensitivity X2 and the sensitivity X1 determined in the Reference Example 1, it was found that, in the liquid immersion lithography process using the fluorine compound liquid as an immersion liquid, the sensitivity ratio for resist film 1 was 2.4, the sensitivity ratio for resist film 2 was 0, and the sensitivity ratio for resist film 3 was 7.5. From the examination under a scanning electron microscope, it was found that, in the resist patterns in the resist films 1 and 3, so-called T-top forms having a T-shaped cross-section of the resist pattern were observed, which caused substantially no practical problem. In contrast, the resist pattern in resist film 2 had excellent form.

Reference Example 2

A protective film was formed on each of the resist films as follows.

Specifically, a protective film material, which was obtained by dissolving a mixed resin comprised of DEM-NUM S-20 (manufactured by DAIKIN INDUSTRIES, Ltd.) and CYTOP (manufactured by ASAHI GLASS CO., LTD.) (weigh ratio=1:5) in perfluorotributylamine so that the resin concentration became 2.5 wt %, was applied onto each resist film by spin coating, and heated at 90° C. for 60 seconds to form a protective film having a thickness of 37 nm.

A resist pattern was formed by a normal exposure process in the same manner as in the Reference Example 1 except that the protective film was formed on each of the resist films 1, 2, and 3 and the protective film was removed using perfluoro(2-butyltetrahydrofuran) after the exposure.

The obtained resist patterns each having a 130 nm line and space of 1:1 were individually examined under a scanning electron microscope (SEM), and their sensitivities (Eop) were determined. The resist patterns formed in the resist films 1, 2, and 3 had sensitivities (X1) of 19.0, 12.0, and 19.0 mJ/cm$^2$, respectively.

The reduction in the film thickness was observed in the resist patterns in the resist films 1 and 2, but the resist pattern in resist film 3 had excellent form such that no reduction in the film thickness was observed.

Example 3

A protective film was formed on each of the resist films as follows.

Specifically, a protective film material, which was obtained by dissolving a mixed resin comprised of DEM-NUM S-20 (manufactured by DAIKIN INDUSTRIES, Ltd.) and CYTOP (manufactured by ASAHI GLASS CO., LTD.) (weigh ratio=1:5) in perfluorotributylamine so that the resin concentration became 2.5 wt %, was applied onto each resist film by spin coating, and heated at 90° C. for 60 seconds to form a protective film having a thickness of 37 nm.

A resist pattern was formed by a liquid immersion lithography process in the same manner as in the Example 1 except that the protective film was formed on each of the resist films 1, 2, and 3 and the protective film was removed using perfluoro(2-butyltetrahydrofuran) after the pure water dropping step following the exposure.

The obtained resist patterns each having a 130 nm line and space of 1:1 were individually examined under a scanning electron microscope (SEM), and their sensitivities (Eop) were determined. The resist patterns formed in the resist films 1, 2, and 3 had sensitivities (X2) of 19.5, 12.5, and 19.5 mJ/cm$^2$, respectively. From the sensitivity X2 and the sensitivity X1 determined in the Reference Example 2, it was found that, in the liquid immersion lithography process in which pure water was used as an immersion liquid and a protective film was formed, the sensitivity ratio for resist film 1 was 2.6, the sensitivity ratio for resist film 2 was 4.2, and the sensitivity ratio for resist film 3 was 2.6. From the examination under a scanning electron microscope, it was found that the reduction in the film thickness, which caused substantially no practical problem, was observed in the resist patterns in resist films 1 and 2. In contrast, the resist pattern in resist film 2 had excellent form such that no reduction in the film thickness was observed.

Comparative Example 1

The component (A), component (B), and component (D) shown below were uniformly dissolved in the component (C) to prepare positive resist composition 10.

As the component (A), 100 parts by mass of a polymer comprising constitutional units represented by the chemical formula (14) below was used. The component (A) prepared had a mass average molecular weight of 10000.

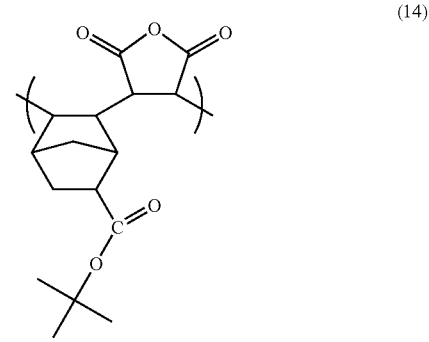

(14)

In the positive resist composition, acid generated from the component (B) causes the acid-dissociative dissolution inhibiting group contained in the component (A) to dissociate, thus changing the whole component (A) from being alkali-insoluble to being alkali-soluble.

For this reason, in the formation of a resist pattern, when the positive resist composition applied to a substrate is selectively exposed through a mask pattern, the alkali-solubility of the exposed portion increases, enabling alkaline development.

As the component (B), 3.5 parts by mass of triphenylsulfonium nonafluorobutanesulfonate and 1.0 part by mass of (4-methylphenyl)diphenylsulfonium trifluoromethanesulfonate were used.

As the component (C), 1900 parts by mass of a mixed solvent of propylene glycol monomethyl ether acetate and ethyl lactate (mass ratio=6:4) was used.

As the component (D), 0.3 part by mass of triethanolamine was used.

Using the prepared positive resist composition 10, a resist pattern was formed. An organic antireflection coating composition "AR-19" (trade name; manufactured by Shipley) was first applied onto a silicon wafer using a spinner, and dried by calcination on a hot plate at 215° C. for 60 seconds to form an organic antireflection coating film having a thickness of 82 nm. The obtained positive resist composition 10 was then applied onto the antireflection coating film using a spinner, and dried by prebake on a hot plate at 115° C. for 90 seconds to form a resist layer having a thickness of 150 nm on the antireflection coating film.

Next, the resist layer was selectively irradiated through a mask pattern with an ArF excimer laser (193 nm) by means of exposure system NSR-S302B (manufactured by Nikon Corporation; NA (numerical aperture)=0.60, σ=0.75). In a simulated immersion lithography treatment, while rotating the silicon wafer having the resist layer exposed, pure water was allowed to fall dropwise against the resist layer at 23° C. for 5 minutes.

Subsequently, the resist layer was subjected to PEB treatment under conditions at 115° C. for 90 seconds, and subjected to development using an alkaline developer solution at 23° C. for 60 seconds. As the alkaline developer solution, a 2.38% by mass aqueous solution of tetramethylammonium hydroxide was used.

Thus formed resist pattern having a 130 nm line and space of 1:1 was examined under a scanning electron microscope (SEM), and its sensitivity (Eop) was determined. The Eop was 9.1 mJ/cm$^2$, and this is taken as X2. The resist pattern had no T-top form, but it was poor such that surface roughening was observed.

On the other hand, using resist composition 10 in the present Comparative Example 1, a normal exposure lithography process conventionally used was conducted instead of the simulated immersion lithography, that is, a resist pattern was formed in the same manner as that mentioned above except that the simulated immersion lithography treatment was not conducted. The Eop was 8.4 mJ/cm$^2$, and this is taken as X1.

Subsequently, the absolute value of $[(X2/X1)-1] \times 100$ was determined, and the result was 8.3.

Comparative Examples 2 and 3

Using resist composition 10 having the same formulation as that in the Comparative Example 1, an "AR-19" film of 82 nm was formed on a substrate (silicon wafer) and a resist layer was formed on the film in the same manner as in the Comparative Example 1 except that the thickness of the resist film was changed to 140 nm. In the evaluation test 2, using laboratory equipment prepared by Nikon Corporation, immersion lithography was conducted by 193-nm two-beam interferometry using a prism and water. A similar method is disclosed in the Non-patent document 2, which is known as a method by which a line and space pattern can be easily obtained in a laboratory scale. In the immersion lithography in the present Comparative Example 2, a solvent layer of water as an immersion solvent was formed between the resist layer and the bottom surface of the prism. The exposure energy was selected so that the line and space pattern was constantly obtained.

On the other hand, in Comparative Example 3, an experiment was performed such that the prism was directly in contact with the resist layer without using the water solvent as an immersion solvent.

Development was conducted in the same manner as in the Comparative Example 1.

The results are shown in Table 1.

TABLE 1

| | Comparative Example 2 | Comparative Example 3 |
| --- | --- | --- |
| Solvent | Pure water | None (Air) |
| Line width of target (nm) | 90.0 | 90.0 |
| Pitch of target (nm) | 180.0 | 180.0 |
| Line width of pattern obtained (nm) | Non-dissolution due to pattern collapse or T-top form | 85.2 |
| Pitch of pattern obtained (nm) | Non-dissolution due to pattern collapse or T-top form | 179.9 |
| Exposure energy (mJ/cm$^2$) | Not calculable | 3.7 |

From the results of the Comparative Examples 2 and 3 and the Comparative Example 1, it is apparent that, when the absolute value of $[(X2/X1)-1] \times 100$ is more than 8.0, a resist pattern cannot be formed by the liquid immersion lithography.

From the results of the Examples 1 to 3 and the Reference Examples 1 and 2, it is found that, with respect to the resist composition of the present invention, when a comparison is made between the sensitivity in the simulated immersion lithography treatment and the sensitivity in the normal exposure treatment, any absolute value defined in the present invention is equal to or less than 8. That is, it is found that the resist composition of the present invention is a resist composition suitable for formation of a resist pattern by the immersion lithography, which is advantageous not only in that the lowering of the sensitivity is small even when the resist is in contact with water or a fluorine solvent, but also in that the resolution and the resist pattern form are excellent, for example, neither a T-top form nor surface roughening are caused. Furthermore, when a protective film was formed, similar effects were confirmed.

On the other hand, from the results of the Comparative Examples 1, 2, and 3, it is found that, with respect to the resist composition using a resin having constitutional units containing an anhydride of dicarboxylic acid, when a comparison is made between the sensitivity in the simulated immersion lithography treatment and the sensitivity in the normal exposure treatment, the absolute value defined in the first aspect is 8.3 and the lowering of the sensitivity is considerable, and the resist pattern is poor such that surface roughening is caused, and thus the resist composition is unsuitable for the immersion lithography.

Comparative Example 4

The component (A), component (B), and component (D) shown below were uniformly dissolved in the component (C) to prepare positive resist composition 11.

As the component (A), 100 parts by mass of a copolymer comprising constitutional units of 63 mol % of hydroxystyrene unit, 24 mol % of styrene and 13 mol % of tert-butyl acrylate unit was used. The component (A) prepared had a mass average molecular weight of 12000.

As the component (B), 2.8 parts by mass of bis(tert-butylphenyliodonium trifluoromethanesulfonate and 1.0 parts by mass of dimethylmonophenylsulfonium trifluoromethanesulfonate were used.

As the component (C), 600 parts by mass of ethyl lactate was used.

As the component (D), 0.26 part by mass of triethanolamine was used, and as the component (E), 0.28 part by mass of phenylphosphonic acid was used.

Using the prepared positive resist composition 11, a resist pattern was formed.

An organic antireflection coating composition "AR-3" (trade name; manufactured by Shipley) was first applied onto a silicon wafer using a spinner, and dried by calcination on a hot plate at 220° C. for 60 seconds to form an organic antireflection coating film having a thickness of 62 nm. The obtained positive resist composition 11 was then applied onto the antireflection coating film using a spinner, and dried by prebake on a hot plate at 110° C. for 90 seconds to form a resist layer having a thickness of 280 nm on the antireflection coating film.

Next, the resist layer was selectively irradiated through a mask pattern with a KrF excimer laser (248 nm) by means of exposure system NSR-S203B (manufactured by Nikon Corporation; NA (numerical aperture)=0.60).

In a simulated immersion lithography treatment, while rotating the silicon wafer having the resist layer exposed, pure water was allowed to fall dropwise against the resist layer at 23° C. for 5 minutes.

Subsequently, the resist layer was subjected to PEB treatment under conditions at 110° C. for 90 seconds, and subjected to development using an alkaline developer solution at 23° C. for 60 seconds. As the alkaline developer solution, a 2.38% by mass aqueous solution of tetramethylammonium hydroxide was used.

Thus formed resist pattern having a 140 nm line and space of 1:1 was examined under a scanning electron microscope (SEM), and its sensitivity (Eop) was determined.

Accordingly the Eop was 22.0 mJ/cm$^2$, and this is taken as X2. The resist pattern had a T-top form, and was poor such that surface roughening was observed.

On the other hand, using resist composition 11 in the present Comparative Example 4, a normal exposure lithography process conventionally used was conducted instead of the simulated immersion lithography, that is, a resist pattern was formed in the same manner as that mentioned above except that the simulated immersion lithography treatment was not conducted. The Eop was 20.0 mJ/cm$^2$, and this is taken as X1.

Subsequently, the absolute value of $[(X2/X1)-1] \times 100$ was determined, and the result was 10. A ratio of the sensitivity in the simulated immersion lithography treatment to the sensitivity in the normal exposure (22.0/20.0) was determined, and the result was 1.1.

Comparative Example 5

The component (A), component (B), and component (D) shown below were uniformly dissolved in the component (C) to prepare positive resist composition 12.

As the component (A), a mixed resin of 70 parts by mass of a copolymer comprising constitutional units comprised of 64 mol % of hydroxystyrene units and 36 mol % of 1-ethoxy-1-ethyloxystyrene units and 30 parts by mass of a copolymer comprising constitutional units comprised of 67 mol % of hydroxystyrene units and 33 mol % of tetrahydropyranyloxystyrene units was used. The component (A) prepared had a mass average molecular weight of 8000.

As the component (B), 4 parts by mass of bis(cyclohexylsulfonyl)diazomethane and 1 part by mass of tert-butylphenyliodonium trifluoromethanesulfonate were used.

As the component (C), 600 parts by mass of a mixed solvent of propylene glycol monomethyl ether acetate and ethyl lactate (mass ratio=6:4) was used.

As the component (D), 0.52 part by mass of triisopropanolamine was used, and as the component (E), 0.54 part by mass of dodecanoic acid was used.

Using the prepared positive resist composition 12, a resist pattern was formed.

An organic antireflection coating composition "DUV-44" (trade name; manufactured by Brewer Science) was first applied onto a silicon wafer using a spinner, and dried by calcination on a hot plate at 225° C. for 90 seconds to form an organic antireflection coating film having a thickness of 65 nm. The obtained positive resist composition was then applied onto the antireflection coating film using a spinner, and dried by prebake on a hot plate at 90° C. for 90 seconds to form a resist layer having a thickness of 280 nm on the antireflection coating film.

Next, the resist layer was selectively irradiated through a mask pattern with a KrF excimer laser (248 nm) by means of exposure system NSR-S203B (manufactured by Nikon Corporation; NA (numerical aperture)=0.60).

In a simulated immersion lithography treatment, while rotating the silicon wafer having the resist layer exposed, pure water was then allowed to fall dropwise against the resist layer at 23° C. for 5 minutes.

Subsequently, the resist layer was subjected to PEB treatment under conditions at 110° C. for 90 seconds, and subjected to development using an alkaline developer solution at 23° C. for 60 seconds. As the alkaline developer solution, a 2.38% by mass aqueous solution of tetramethylammonium hydroxide was used.

Thus formed resist pattern having a 140 nm line and space of 1:1 was examined under a scanning electron microscope (SEM), and its sensitivity (Eop) was determined.

Accordingly, the Eop was 26.3 mJ/cm$^2$, and this is taken as X2. The resist pattern had no T-top form, but was poor such that surface roughening was observed.

On the other hand, using resist composition 12 in the present Comparative Example 5, a normal exposure lithography process conventionally used was conducted instead of the simulated immersion lithography, that is, a resist pattern was formed in the same manner as that mentioned above except that the simulated immersion lithography treatment was not conducted. The Eop was 16.8 mJ/cm$^2$, and this is taken as X1.

Subsequently, the absolute value of $[(X2/X1)-1] \times 100$ was determined, and the result was 56.5. A ratio of the sensitivity in the simulated immersion lithography treatment to the sensitivity in the normal exposure (26.3/16.8) was determined, and the result was 1.57.

From the results of the Comparative Examples 4 and 5, it is found that, in the formation of a resist pattern using not an ArF excimer laser but a KrF excimer laser, with respect to the resist composition using a resin having phenolic hydroxyl group-containing constitutional units, when a comparison is made between the Eop in the simulated immersion lithography treatment and the Eop in the normal exposure, the absolute value defined in the first aspect is 10 or 56.5 and the lowering of the sensitivity is considerable, and a T-top form or surface roughening is caused in the resist pattern, and thus the resist composition is unsuitable for the immersion lithography.

The use of the resin having a phenolic hydroxyl group is common to "UVII-HS" used in the Non-patent document 1 mentioned as prior art and positive resist compositions 11 and 12 used in the Comparative Examples 4 and 5.

In each of the Examples 1 to 3, the evaluation test 1 was performed, and practical immersion lithography was not conducted but the simulated immersion lithography treatment in which merely water or a fluorine solvent was allowed to fall dropwise was conducted. However, in the evaluation test 1, pure water or a fluorine solvent at 23° C. was allowed to fall dropwise for several minutes while rotating the silicon wafer, and hence the conditions are more stringent than those for the immersion lithography. Therefore, it is apparent that, when the resist composition having no problem of the sensitivity or resist pattern form in the evaluation test 1 is applied to the immersion lithography, it achieves an effect of improving the resolution or depth of focus in the immersion lithography.

Example 4

Example 4 is an example in which, like the Comparative Examples 2 and 3, the evaluation test 2 for the properties of the liquid immersion lithography employed in the present invention, namely, the evaluation test using "a method comprising, using an interfered light caused by a prism as a pattern light for exposure, subjecting a sample immersed in a liquid to exposure (two-beam interferometry exposure method)", which simulated the practical production process, was employed as an evaluation test for the resist pattern resolution in the liquid immersion lithography.

As a resist film, using the resist composition having the same formulation as that for resist film 2, resist film 2' formed in the same manner as in resist film 2 except that the prebake was changed to be conducted at 115° C. and that the thickness of the resist film was changed to 150 nm was used. The reason why the thickness of the resist film was changed from 250 nm to 150 nm resides in that the desired resolution is 65 nm and an aspect ratio of 1:3 or less is needed since an aspect ratio of 1:3 or more is likely to cause the resist pattern formed to suffer collapse. A resist pattern was formed in resist film 2' by a two-beam interferometry liquid immersion lithography method using a fluorine compound solution (perfluoro(2-butyltetrahydrofuran) having a boiling point of 102° C.) as an immersion liquid.

As a practical exposure system, liquid immersion lithography laboratory equipment, manufactured by Nikon Corporation, which can realize the "two-beam interferometry exposure method", was used. In the liquid immersion lithography laboratory equipment, the immersion liquid is present in a narrow space between a prism, which is an optical element closest to the object to be exposed (resist film), and the resist film. The immersion liquid is directly in contact with both the prism and the resist film, and the wettability of the immersion liquid with respect to each of the prism and the resist film and the surface tension of the immersion liquid on each exposed surface are adjusted so that, even when the prism is moved in a predetermined range for the resist film, the immersion liquid easily follows both the prism and the resist film to constantly keep the immersion state for the exposure.

The light source in this system was the same as the light source in exposure system NSR-S302A (manufactured by Nikon Corporation; NA (numerical aperture)=0.60, ⅔ annular illumination) used in the Example 1, that is, an ArF excimer laser (193 nm) was used. Using this light source, the resist film was irradiated through the immersion liquid with an interfered light having an interference band at a line width of 65 nm.

After the exposure, the substrate was dried to completely remove perfluoro(2-butyltetrahydrofuran) as the immersion liquid from resist film 2'.

Subsequently, the resist film was subjected to PEB treatment under conditions at 115° C. for 90 seconds, and subjected to development using an alkaline developer solution at 23° C. for 60 seconds. As the alkaline developer solution, a 2.38% by mass aqueous solution of tetramethylammonium hydroxide was used.

Thus obtained substrate surface was examined under a scanning electron microscope. Accordingly, it was confirmed that a resist pattern having a 65 nm line and space of 1:1 was formed (pitch: 130 nm). The resist pattern formed in resist film 2' had a sensitivity (X2) of 4.0 mJ/cm$^2$.

Example 5

A resist pattern was formed in the same manner as in the Example 4 except that pure water was used as the immersion liquid, that the thickness of the resist film was changed to 135 nm, and that the prebake was changed to prebake at 125° C. for 90 seconds.

Thus obtained substrate surface was examined under a scanning electron microscope. Similar to the result obtained in the Example 4, it was confirmed that a resist pattern having a 65 nm line and space of 1:1 was formed. The resist pattern formed in the resist film had a sensitivity (X2) of 8.1 mJ/cm$^2$.

Example 6

In Example 6, an evaluation was conducted using the same resist composition as that used in the Example 4 except that a protective film was formed on the resist film.

An organic antireflection coating composition "AR-19" (trade name; manufactured by Shipley) was applied onto a silicon wafer using a spinner, and dried by calcination on a hot plate at 215° C. for 60 seconds to form an organic antireflection coating film having a thickness of 82 nm. The positive resist composition was applied onto the antireflection coating film using a spinner, and dried by prebake on a hot plate at 95° C. for 90 seconds to form a resist layer having a thickness of 130 nm on the antireflection coating film. A fluorine protective film material, which was obtained by dissolving a mixed resin comprised of DEMNUM S-10 (manufactured by DAIKIN INDUSTRIES, Ltd.) and CYTOP (manufactured by ASAHI GLASS CO., LTD.) (weight ratio=1:5) in perfluorotributylamine so that the resin concentration became 2.5 wt %, was then applied onto the resist film by spin coating, and heated at 90° C. for 60 seconds to form a protective film having a thickness of 37 nm.

In the evaluation test 2, using laboratory equipment prepared by Nikon Corporation, immersion lithography was conducted by 193-nm two-beam interferometry using a prism and water (two-beam interferometry experiment). A similar method is disclosed in the Non-patent document 2, which is known as a method by which a line and space pattern can be easily obtained in a laboratory scale.

In the immersion lithography in the Example 6, a solvent layer of water as an immersion solvent was formed between the top surface of the protective film and the bottom surface of the prism.

The exposure energy was selected so that the line and space pattern was constantly obtained. Next, the resist film was subjected to PEB treatment under conditions at 90° C. for 90 seconds, and the protective film was removed using perfluoro(2-butyltetrahydrofuran). Development was then conducted in the same manner as in the Example 1. Accordingly, it was found that a 65 nm line and space (1:1) was obtained. The sensitivity (X2) was 4.0 mJ/cm², and the pattern form had high squareness.

As mentioned above, in the Examples in the present invention, an experiment was performed using not an $F_2$ excimer laser but an ArF excimer laser, and from the fact that "a 130 nm line and space of 1:1 is formed using an ArF excimer laser", those skilled in the art easily expect that "a resist pattern having a 110 nm line and space of 1:1 is formed by a normal exposure lithography process using an $F_2$ excimer laser light source having a wavelength of 157 nm" in the first aspect for the following reason. When it is presumed that the numerical aperture NA in the exposure system is the same, considering 105 nm determined by multiplying a desired resolution (130 nm when using ArF in this case) by 0.81 (157 nm/193 nm) and the practical mask design, a line and space formed using an $F_2$ excimer laser is 110 nm. This point can be further easily expected from the fact that a 65 nm L&S pattern is formed using an interference band at a line width of 65 nm by the two-beam liquid immersion lithography laboratory equipment which simulated the practical exposure system in the Examples 4, 5, and 6.

Thus, from the Examples in the present invention, it is clear that, in the resist pattern size equal to or smaller than 50 nm, which is intended in the liquid immersion lithography process, especially in the process using an $F_2$ excimer laser, a resist pattern having high squareness can be obtained.

Example 7

Evaluation Test 1 for Resist

Relative to 100 parts by weight of the copolymerized polymer used for resist film 1, 5 parts by weight of triphenylsulfonium nonafluorobutanesulfonate as an acid generator, 0.4 part by weight of triisopropanolamine as an amine, 0.1 part by weight of salicylic acid as an organic carboxylic acid, and 5.0 parts by weight of a compound represented by the chemical formula (13) below as a dissolution inhibitor were dissolved so that the resultant propylene glycol monomethyl ether acetate solution had a solids content of 8.5% by weight to obtain a resist composition in the form of a uniform solution.

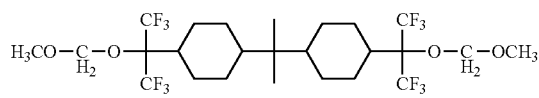
(13)

Using the prepared positive resist composition, a resist pattern was formed. An organic antireflection coating composition "AR-19" (trade name; manufactured by Shipley) was first applied onto a silicon wafer using a spinner, and dried by calcination on a hot plate at 215° C. for 60 seconds to form an organic antireflection coating film having a thickness of 82 nm. The obtained positive resist composition was then applied onto the antireflection coating film using a spinner, and dried by prebake on a hot plate at 90° C. for 90 seconds to form a resist layer having a thickness of 150 nm on the antireflection coating film.

On the other hand, 500 g of a 20 wt % aqueous solution of EF-101 (manufactured by Tohchem Products) which is perfluorooctylsulfonic acid ($C_8F_{17}SO_3H$) and 80 g of a 20 wt % aqueous solution of monoethanolamine were mixed together. 25 g of the resultant mixed solution was added to 20 g of a 10 wt % aqueous solution of polyvinylpyrrolidone, and to the resultant aqueous solution was added pure water so that the whole weight became 200 g to prepare a resist protective film-forming material for liquid immersion lithography process. The pH of the resist protective film-forming material was 2.7.

The resist protective film-forming material was applied onto the resist film, and spin-dried to form a resist protective film having a thickness of 44 nm.

The resist film was then selectively irradiated (exposed) through a mask pattern with an ArF excimer laser (wavelength: 193 nm) by means of exposure system NSR-S302B (manufactured by Nikon Corporation; NA (numerical aperture)=0.60, ⅔ annular illumination), and then subjected to PEB treatment under conditions at 120° C. for 90 seconds.

Next, in a liquid immersion lithography treatment, while rotating the silicon wafer having the resist film exposed, perfluoro(2-butyltetrahydrofuran), which is fluorine-based liquid, at 23° C. was allowed to fall dropwise against the resist film for 1 minute. This step corresponds to the step in the practical production process in which the resist film completely immersed in the liquid is exposed, but based on the above-mentioned analysis on the liquid immersion lithography method, the exposure in the optics is surely completed theoretically, and therefore, for achieving an evaluation of only the effect of the immersion liquid on the resist film which is previously exposed, the step has a simplified configuration such that the fluorine-based liquid as a refractive index liquid (immersion liquid) is applied to the resist film after the exposure.

The resist film was then subjected to development using an alkaline developer solution at 23° C. for 60 seconds. As the alkaline developer solution, a 2.38% by mass aqueous solution of tetramethylammonium hydroxide was used.

The obtained resist pattern having a 130 nm line and space of 1:1 was examined under a scanning electron microscope (SEM), and as a result, the pattern profile was excellent such that no fluctuation was observed. The exposure sensitivity was 18.54 mJ/cm² (sensitivity in the liquid immersion lithography treatment), and a change of the sensitivity relative to the sensitivity in a general dry process was 0.05% and there was almost no difference between that sensitivity and the sensitivity in the case where the fluorine-based liquid was not used. The exposure margin (EL margin) was 6.09%. From the results, it is apparent that the fluorine solvent comprised of perfluoro(2-butyltetrahydrofuran) does not affect the resist film in the liquid immersion process.

Example 8

Evaluation Test 1 for Resist

A resist pattern was formed in the same manner as in Example 7 except that perfluoro(2-butyltetrahydrofuran) as fluorine-based liquid used in the liquid immersion lithography treatment was changed to perfluorotripropylamine.

The obtained resist pattern having a 130 nm line and space of 1:1 was examined under a scanning electron microscope (SEM), and as a result, the pattern profile was excellent such that no fluctuation was observed. The exposure sensitivity was 19.03 mJ/cm² (sensitivity in the liquid immersion lithography treatment), and a change of the sensitivity relative to the sensitivity in a general dry process was 2.58% and there was a small difference between that sensitivity and the sensitivity in the case where the fluorine-based liquid was dropped. The exposure margin (EL margin) was 5.96%. From the results, it is apparent that the fluorine solvent comprised of perfluorotripropylamine does not affect the resist film in the liquid immersion process.

Example 9

Evaluation Test 3 for Resist

Relative to 100 parts by weight of the copolymerized polymer used for resist film 2, 2 parts by weight of triphenylsulfonium nonafluorobutanesulfonate as an acid generator and 0.6 part by weight of tridodecylamine as an amine were dissolved so that the resultant propylene glycol monomethyl ether acetate solution had a solids content of 8.5% by weight to obtain a resist composition in the form of a uniform solution.

The resist composition was applied onto a silicon wafer by spin coating, and heated at 90° C. for 90 seconds to form a resist coating film having a thickness of 150 nm. This film is referred to as "unexposed coating film".

On the other hand, the resist coating film was irradiated with an $F_2$ excimer laser (157 nm) by means of contact exposure system VUVES-4500 (manufactured by Litho Tech Japan Co., Ltd.) at a large area (about 10 $mm^2$) region which could be visually recognized. The exposure energy was 40 $mJ/cm^2$. The resist film was then subjected to PEB treatment under conditions at 120° C. for 90 seconds. This film is referred to as "exposed coating film".

Subsequently, the unexposed coating film and the exposed coating film were individually immersed in perfluorotripropylamine, and a change of the thickness of each coating film immersed in the liquid was measured by means of "RDA-QZ3", manufactured by Litho Tech Japan Co., Ltd., which is a film thickness meter using a quartz crystal microbalance (hereinafter, referred to as "QCM"), at the maximum measurement time of 300 seconds.

The data obtained by measuring a frequency change for the quartz substrate was processed by an appended analysis soft to form a graph of the film thickness against the immersion time. The graph obtained in the present Example is shown in FIG. 1.

For clearly showing the difference in change of the film thickness between the exposed film and the unexposed film in each sample, a difference between the film thickness and that at an immersion time of 0 seconds as a reference was replotted on the graph. In other words, when the thickness is smaller than the initial film thickness, a negative number is plotted, and when the thickness is larger than the initial film thickness, a positive number is plotted. With respect to each sample, the maximum of the film thickness change in the positive direction and the maximum of the film thickness change in the negative direction were determined. When there was no change in the film thickness in the positive or negative direction, the number was 0 nm.

The maximum increase in thickness of the unexposed coating film in 10 seconds from the start of the measurement was 1.26 nm, and that of the exposed coating film was 1.92 nm. The maximum decrease in thickness of the unexposed coating film in 10 seconds was 0 nm, and that of the exposed coating film was 0.49 nm.

Example 10

Evaluation Test 2 for Resist

100 Parts by mass of a fluorine polymer of the chemical formula (12), 2.0 parts by weight of triphenylsulfonium nonafluorobutanesulfonate as an acid generator, and 0.6 part by weight of tridodecylamine as an amine were dissolved so that the resultant propylene glycol monomethyl ether acetate solution had a solids content of 8.5% by weight to obtain a resist composition in the form of a uniform solution.

Using the prepared positive resist composition, a resist pattern was formed. An organic antireflection coating composition "AR-19" (trade name; manufactured by Shipley) was first applied onto a silicon wafer using a spinner, and dried by calcination on a hot plate at 215° C. for 60 seconds to form an organic antireflection coating film having a thickness of 82 nm. The obtained positive resist composition was then applied onto the antireflection coating film using a spinner, and dried by prebake on a hot plate at 95° C. for 90 seconds to form a resist layer having a thickness of 102 nm on the antireflection coating film. Subsequently, a fluorine protective film material, which was obtained by dissolving a mixed resin comprised of DEMNUM S-10 (manufactured by DAIKIN INDUSTRIES, Ltd.) and CYTOP (manufactured by ASAHI GLASS CO., LTD.)(weight ratio=1:5) in perfluorotributylamine so that the resin concentration became 2.5 wt %, was applied onto the resist film by spin coating, and heated at 95° C. for 60 seconds to form a protective film having a thickness of 30 nm.

In the evaluation test 2, using laboratory equipment prepared by Nikon Corporation, immersion lithography was conducted by 193-nm two-beam interferometry using a prism and water (two-beam interferometry experiment). A similar method is disclosed in the Non-patent document 2, which is known as a method by which a line and space pattern can be easily obtained in a laboratory scale.

In the immersion lithography in the present Example, a solvent layer of water as an immersion solvent was formed between the top surface of the protective film and the bottom surface of the prism.

The exposure energy was selected so that the line and space pattern was constantly obtained. Next, the resist film was subjected to PEB treatment under conditions at 115° C. for 90 seconds, and the protective film was removed using perfluoro(2-butyltetrahydrofuran). The resist film was then subjected to development treatment using a 2.38% by mass aqueous solution of tetramethylammonium hydroxide at 23° C. for 60 seconds. Accordingly, it was found that a 65 nm line and space (1:1) was obtained. The sensitivity (X2) was 2.8 $mJ/cm^2$, and the pattern form had high squareness.

Example 11

Evaluation Test 2 for Resist

A resist pattern was formed in the same manner as in Example 10 except that no protective film was formed on the resist film, and that perfluorotripropylamine was used as the immersion solvent. Accordingly, it was found that a 65 nm line and space (1:1) was obtained. The sensitivity was 11.3 $mJ/cm^2$, and the pattern form was slightly in a T-TOP form but excellent.

Example 12

Evaluation Test 2 for Resist

A resist pattern was formed in the same manner as in the Example 10 except that no protective film was formed on the resist film. Accordingly, it was found that a 65 nm line and space (1:1) was obtained. The sensitivity was 2.8 mJ/cm$^2$, and the pattern form was slightly in a T-TOP form but excellent.

Example 13

Evaluation Test 2 for Resist

A pattern was formed using the same resist composition as that used in the Example 10.

An organic antireflection coating composition "AR19" (trade name; manufactured by Shipley) was first applied onto a silicon wafer using a spinner, and dried by calcination on a hot plate at 215° C. for 60 seconds to form an organic antireflection coating film having a thickness of 82 nm. The obtained positive resist composition was then applied onto the antireflection coating film using a spinner, and dried by prebake on a hot plate at 95° C. for 90 seconds to form a resist layer having a thickness of 102 nm on the antireflection coating film. On the other hand, 500 g of a 20 wt % aqueous solution of EF-101 (manufactured by Tohchem Products) which is perfluorooctylsulfonic acid ($C_8F_{17}SO_3H$) and 80 g of a 20 wt % aqueous solution of monoethanolamine were mixed together. 25 g of the resultant mixed solution was added to 20 g of a 10 wt % aqueous solution of polyvinylpyrrolidone, and to the resultant aqueous solution was added pure water so that the whole weight became 200 g to prepare a resist protective film-forming material for liquid immersion lithography process. The pH of the resist protective film-forming material was 2.7. The resist protective film-forming material was applied onto the resist film, and dried by heating at 95° C. for 60 seconds to form a resist protective film having a thickness of 35 nm.

In the evaluation test 2, using laboratory equipment prepared by Nikon Corporation, immersion lithography was conducted by 193-nm two-beam interferometry using a prism and perfluorotripropylamine as a fluorine solvent (two-beam interferometry experiment). A similar method is disclosed in the Non-patent document 2, which is known as a method by which a line and space pattern can be easily obtained in a laboratory scale.

In the immersion lithography, a layer of the fluorine solvent as an immersion solvent was formed between the top surface of the protective film and the bottom surface of the prism.

The exposure energy was selected so that the line and space pattern was constantly obtained. Next, the resist film was subjected to PEB treatment under conditions at 115° C. for 90 seconds, and then subjected to development treatment in the same manner as in the Example 10. Accordingly, it was found that a 90 nm line and space (1:1) was obtained. The protective film was water-soluble and hence removed during the development. The sensitivity was 10.4 mJ/cm$^2$, and the pattern form had high squareness.

Example 14

Evaluation Test 2 for Resist

A resist pattern was formed in the same manner as in Example 13 except that the thickness of the resist film was changed to 125 nm. Accordingly, it was found that a 65 nm line and space (1:1) was obtained. The sensitivity was 7.3 mJ/cm$^2$, and the pattern form had high squareness.

Example 15

Evaluation Test 3 for Resist

A change of the thickness of each coating film immersed in the liquid was measured in the same manner as in Example 9, except that perfluorotripropylamine was changed to perfluoro(2-butyltetrahydrofuran), by means of "RDA-QZ3", manufactured by Litho Tech Japan Co., Ltd., which is a film thickness meter using a quartz crystal microbalance (hereinafter, referred to as "QCM"), at the maximum measurement time of 300 seconds. The maximum increase in thickness of the unexposed coating film in 10 seconds from the start of the measurement was 1.62 nm, and that of the exposed coating film was 2.76 nm. The maximum decrease in thickness of the unexposed coating film in 10 seconds from the start of the measurement was 0 nm, and that of the exposed coating film was 0 nm (FIG. 2).

Example 16

Liquid Immersion Contact Exposure

Relative to 100 parts by weight of a fluorine polymer of the chemical formula (12), 5 parts by weight of triphenylsulfonium nonafluorobutanesulfonate as an acid generator and 0.1 part by weight of salicylic acid as an organic carboxylic acid were dissolved so that the resultant propylene glycol monomethyl ether acetate (PGMEA) solution had a solids content of 7% by weight to obtain a resist composition in the form of a uniform solution.

On the other hand, an organic antireflection coating composition "AR-19" (trade name; manufactured by Shipley) was applied onto a silicon wafer using a spinner, and dried by calcination on a hot plate at 215° C. for 60 seconds to form an organic antireflection coating film having a thickness of 82 nm. The obtained resist composition was then applied onto the antireflection coating film using a spinner, and dried by prebake on a hot plate at 90° C. for 90 seconds to form a resist film having a thickness of 120 nm on the antireflection coating film.

A resist pattern was formed in the resist film by a contact liquid immersion lithography process using a fluorine compound solution (perfluorotripropylamine having a boiling point of 130° C.) as an immersion liquid.

Specifically, the resist film was selectively irradiated through a mask pattern (440 nm) closely in contact with the immersion liquid with an $F_2$ excimer laser (157 nm) by means of exposure system VUVES4500 (manufactured by Litho Tech Japan Co., Ltd.). The resist film was then subjected to PEB treatment under conditions at 110° C. for 90 seconds, and subjected to development using an alkaline developer solution at 22° C. for 60 seconds. As the alkaline developer solution, a 2.38% by mass aqueous solution of tetramethylammonium hydroxide was used.

Thus a resist pattern of 214 nm was obtained. The resist pattern was examined under a scanning electron microscope (SEM). As a result, no damage was observed in the resist, which confirmed that the resist composition can be actually used in the contact liquid immersion lithography process.

INDUSTRIAL APPLICABILITY

As described above, the resist composition for liquid immersion lithography process of the present invention is useful in the production of an ultrafine pattern having excellent form stability, and especially advantageously used in the production of a pattern by a liquid immersion lithography process using an $F_2$ excimer laser having a wavelength of 157 nm as a light source. Furthermore, the method for forming a resist pattern of the present invention is useful in the production of an ultrafine pattern having excellent form stability using the resist composition for liquid immersion lithography process.

REFERENCES

Non-patent document 1: Journal of Vacuum Science & Technology B (J. Vac. Sci. Technol. B) (Published in the United States) 1999, Vol. 17, No.6, pp. 3306-3309
Non-patent document 2: Journal of Vacuum Science & Technology B (J. Vac. Sci. Technol. B) (Published in the United States) 2001, Vol. 19, 6th number, pp.2353-2356
Non-patent document 3: Proceedings of SPIE Vol. 4691 (Published in the United States) 2002, Vol. 4691, pp. 459-465
Non-patent document 4: S. Kodama et al., "Synthesis of Novel Fluoropolymer for 157 nm Photoresists by Cyclopolymerization" Proceedings of SPIE, Vol. 4690, (2002) pp 76-83
Patent document 1: International Patent Publication No. WO 00/67072 Pamphlet
Patent document 2: Japanese Patent Application Laid-open No. 2003-2925 Publication
Patent document 3: International Patent Publication No. WO 02/65212 Pamphlet
Patent document 4: International Patent Publication No. WO 02/64648 Pamphlet

The invention claimed is:

1. A method for forming a resist pattern using a liquid immersion lithography process, which comprises:
    forming a resist film on a substrate using a resist composition;
    forming a protective film on the resist film;
    applying a liquid directly onto the protective film;
    selectively exposing the resist film through the liquid and the protective film;
    subjecting the resultant resist film to post exposure bake treatment; and
    subjecting the resist film to development, thus forming a resist pattern,
    wherein the resist composition comprises:
        (A) a polymer comprising (a1) alkali-soluble constitutional units each comprising an alicyclic group having both (i) a fluorine atom or a fluoroalkyl group and (ii) an alcoholic hydroxyl group, wherein the polymer changes in alkali-solubility due to the action of acid;
        (B) an acid generator which generates acid due to exposure to light and
        (C) an amine.

2. The method for forming a resist pattern according to claim 1, wherein the constitutional units (a1) are comprised of a constitutional unit comprising an alcoholic hydroxyl group-containing alkyloxy group, an alcoholic hydroxyl group-containing alkyloxyalkyl group, or an alcoholic hydroxyl group-containing alkyl group bonded to the alicyclic group, wherein the alkyloxy group, the alkyloxyalkyl group, or the alkyl group has part or all of its hydrogen atoms replaced by a fluorine atom or fluorine atoms.

3. The method for forming a resist pattern according to claim 2, wherein the alicyclic group is a polycyclic hydrocarbon group.

4. The method for forming a resist pattern according to claim 3, wherein the polycyclic hydrocarbon group is a group derived from norbornane.

5. The method for forming a resist pattern according to claim 4, wherein the group derived from norbornane is a norbornene ring, wherein the alcoholic hydroxyl group-containing alkyloxy group or the alcoholic hydroxyl group-containing alkyloxyalkyl group has part of the hydrogen atoms in its alkyloxy portion replaced by a fluorine atom or fluorine atoms, or the alcoholic hydroxyl group-containing alkyl group has part of the hydrogen atoms in the alkyl group replaced by a fluorine atom or fluorine atoms, wherein the constitutional units (a1) result from cleavage of the double bond in the norbornene ring.

6. The method for forming a resist pattern according to claim 1, wherein the polymer (A) further comprises (a2) constitutional units derived from a (meth)acrylic ester having an acid-dissociative dissolution inhibiting group.

7. The method for forming a resist pattern according to claim 6, wherein the polymer (A) further comprises fluoroalkylene constitutional units (a3) for improving the polymer in transparency.

8. The method for forming a resist pattern according to claim 6, wherein the acid-dissociative dissolution inhibiting group is a tertiary alkyl group.

9. The method for forming a resist pattern according to claim 7, wherein the constitutional units (a3) are comprised of a unit derived from tetrafluoroethylene.

10. The method for forming a resist pattern according to claim 1, wherein the fluorine atom or fluoroalkyl group (i) and the alcoholic hydroxyl group (ii) in the constitutional units (a1) are individually bonded to the alicyclic group, wherein the alicyclic group constitutes a principal chain.

11. The method for forming a resist pattern according to claim 10, wherein the constitutional units (a1) are comprised of a unit resulting from cyclopolymerization of a diene compound having a hydroxyl group and a fluorine atom.

12. The method for forming a resist pattern according to claim 11, wherein the diene compound is a heptadiene.

13. The method for forming a resist pattern according to claim 12, wherein the heptadiene is 1,1,2,3,3-pentafluoro-4-trifluoromethyl-4-hydroxy-1,6-heptadiene ($CF_2$=$CFCF_2C(CF_3)(OH)CH_2CH$=$CH_2$).

14. The method for forming a resist pattern according to claim 10, wherein the polymer (A) further comprises constitutional units (a4) obtained by replacing the hydrogen atom of the alcoholic hydroxyl group in the constitutional units (a1) with an acid-dissociative dissolution inhibiting group.

15. The method for forming a resist pattern according to claim 14, wherein the acid-dissociative dissolution inhibiting group is a linear, branched, or cyclic alkyloxymethyl group having 1 to 15 carbon atoms.

16. The method for forming a resist pattern according to claim 1, wherein the amine is a tertiary alkylamine having 7 to 15 carbon atoms.

17. The method for forming a resist pattern according to claim 1, which further comprises (C') a dissolution inhibitor having a fluorine atom.

18. The method for forming a resist pattern according to claim 17, wherein the dissolution inhibitor (C') having a fluorine atom is a compound represented by the following general formula (1) or (2):

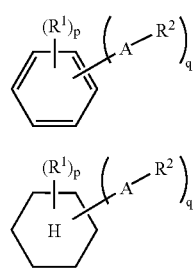

wherein $R^1$ represents a hydrogen atom, an alkyl group, an alkoxy group, or a fluorine atom, $R^2$ represents an acid-dissociative dissolution inhibiting group, A represents a divalent organic group represented by —C($C_nF_{2n+1}$)($C_mF_{2m+1}$)—O—CO—O—, —C($C_nF_{2n+1}$)($C_mF_{2m+1}$)—O—, or —O—CO—O—, and each of n, m, p, and q is independently an integer of 1 to 4, with the proviso that, when A is —O—CO—O—, at least one $R^1$ is replaced by a fluorine atom.

19. The method for forming a resist pattern according to claim 18, wherein the $R^2$ is a linear, branched, or cyclic alkyloxymethyl group having 1 to 15 carbon atoms or a tertiary alkyl group.

20. The method for forming a resist pattern according to claim 18, wherein the compound represented by the general formula (1) or (2) is at least one member selected from the compounds represented by the following chemical formulae

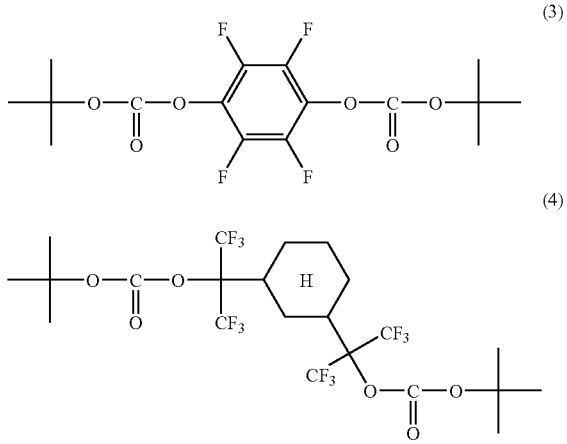

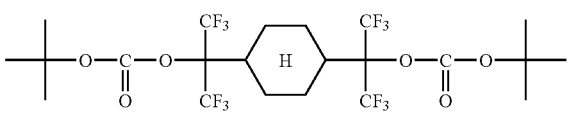

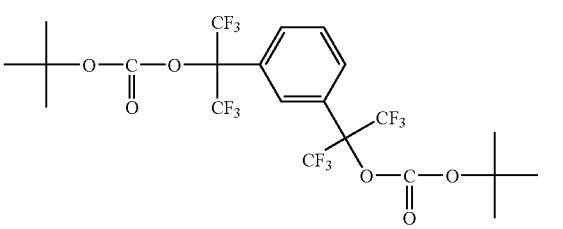

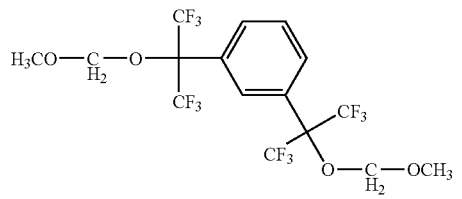

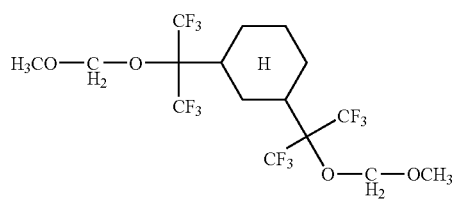

(3) to (8).

21. The method for forming a resist pattern according to claim 17, wherein the amount of the dissolution inhibitor (C') added is 2 to 30 parts by weight, relative to 100 parts by weight of the base polymer (A).

22. The method for forming a resist pattern according to claim 1, wherein the liquid is water comprised of pure water or deionized water.

23. The method for forming a resist pattern according to claim 1, wherein the liquid is a fluorine-based liquid.

24. The method for forming a resist pattern according to claim 1, wherein the liquid immersion lithography process is a process in which the resist film is exposed through a liquid having a predetermined thickness and having a refractive index larger than that of air, wherein the liquid is present at least on the protective film in a path of the lithographic exposure light toward the resist film.

* * * * *